United States Patent
Campbell et al.

(10) Patent No.: US 8,833,096 B2
(45) Date of Patent: Sep. 16, 2014

(54) HEAT EXCHANGE ASSEMBLY WITH INTEGRATED HEATER

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 12/939,541

(22) Filed: Nov. 4, 2010

(65) Prior Publication Data
US 2012/0111034 A1    May 10, 2012

(51) Int. Cl.
- F25D 23/12    (2006.01)
- H05K 7/20    (2006.01)
- F25B 49/02    (2006.01)
- F25B 25/00    (2006.01)

(52) U.S. Cl.
CPC ........... *F25B 25/005* (2013.01); *F25B 2400/01* (2013.01); *H05K 7/20836* (2013.01); *F25B 2700/21171* (2013.01); *F25B 49/02* (2013.01); *F24D 2200/29* (2013.01); *F25B 2500/28* (2013.01); *H05K 7/20809* (2013.01)
USPC ................. 62/259.2; 62/513; 62/225; 62/113

(58) Field of Classification Search
CPC .. F25B 2500/28; F25B 25/005; F25B 47/022; F25D 21/08; F25D 21/14; H05K 7/20836
USPC .......... 62/259.2, 226, 228.1, 228.3, 185, 225; 392/465, 466, 479, 483, 486
See application file for complete search history.

(56) References Cited

U.S. PATENT DOCUMENTS

| | | |
|---|---|---|
| 4,000,626 A | 1/1977 | Webber |
| 4,091,637 A | 5/1978 | Vogel et al. |

(Continued)

FOREIGN PATENT DOCUMENTS

| | | |
|---|---|---|
| CN | 1734212 A | 2/2006 |
| DE | 29903863 U1 | 11/1999 |

(Continued)

OTHER PUBLICATIONS

Torok et al., "Packaging Design of the IBM System z10 Enterprise Class Platform Central Electronic Complex", IBM Journal of Research & Development, vol. 53, No. 1, Paper 9 (2009).

(Continued)

*Primary Examiner* — Cheryl J Tyler
*Assistant Examiner* — Ana Vazquez
(74) *Attorney, Agent, or Firm* — Steve Chiu, Esq.; Kevin P. Radigan, Esq.; Heslin Rothenberg Farley & Mesiti P.C.

(57) ABSTRACT

A heat exchange assembly and apparatus and method employing the heat exchange assembly are provided. The heat exchange assembly includes a coolant-to-refrigerant heat exchanger and a heater. The heat exchanger includes a coolant inlet and a coolant outlet for passing a coolant through the heat exchanger, and a refrigerant inlet and a refrigerant outlet for separately passing a refrigerant through the heat exchanger. The heat exchanger cools coolant passing through the heat exchanger by dissipating heat from coolant passing through the heat exchanger to refrigerant passing through the heat exchanger. The heater is integrated with the heat exchanger and applies an auxiliary heat load to refrigerant passing through the heat exchanger to facilitate ensuring that refrigerant passing through the heat exchanger absorbs at least a specified minimum heat load, for example, to ensure that refrigerant egressing from the refrigerant outlet of the heat exchanger is superheated vapor refrigerant.

20 Claims, 13 Drawing Sheets

(56) References Cited

U.S. PATENT DOCUMENTS

| | | | |
|---|---|---|---|
| 4,313,310 A | | 2/1982 | Kobayashi et al. |
| 4,571,951 A | * | 2/1986 | Szymaszek ............... 62/212 |
| 4,598,764 A | | 7/1986 | Beckey |
| 4,831,830 A | | 5/1989 | Swenson |
| 4,934,155 A | | 6/1990 | Lowes |
| 4,993,481 A | | 2/1991 | Kamimoto et al. |
| 5,060,481 A | | 10/1991 | Bartlett et al. |
| 5,217,063 A | | 6/1993 | Scaringe et al. |
| 5,412,884 A | | 5/1995 | Staples et al. |
| 5,514,595 A | | 5/1996 | Olds et al. |
| 5,597,533 A | | 1/1997 | Olds et al. |
| 5,737,923 A | | 4/1998 | Gilley et al. |
| 5,860,280 A | | 1/1999 | Recine, Sr. et al. |
| 5,867,990 A | | 2/1999 | Ghoshal et al. |
| 5,963,458 A | | 10/1999 | Cascia |
| 5,970,731 A | | 10/1999 | Hare et al. |
| 6,003,319 A | | 12/1999 | Gilley et al. |
| 6,037,567 A | * | 3/2000 | Inoue et al. ............... 219/202 |
| 6,164,076 A | | 12/2000 | Chu et al. |
| 6,213,194 B1 | | 4/2001 | Chrysler et al. |
| 6,305,463 B1 | | 10/2001 | Salmonson |
| 6,351,950 B1 | | 3/2002 | Duncan |
| 6,397,618 B1 | | 6/2002 | Chu et al. |
| 6,474,074 B2 | | 11/2002 | Choshal |
| 6,557,354 B1 | | 5/2003 | Chu et al. |
| 6,705,089 B2 | | 3/2004 | Chu et al. |
| 6,747,872 B1 | | 6/2004 | Patel et al. |
| 6,760,221 B2 | | 7/2004 | Goth et al. |
| 6,786,081 B1 | | 9/2004 | Hildebrandt et al. |
| 6,820,435 B2 | | 11/2004 | Anderson et al. |
| 6,829,145 B1 | | 12/2004 | Corrado et al. |
| 6,845,622 B2 | | 1/2005 | Sauciuc et al. |
| 6,993,920 B2 | | 2/2006 | Lifson et al. |
| 7,073,341 B2 | | 7/2006 | Tongu et al. |
| 7,085,626 B2 | | 8/2006 | Harrod et al. |
| 7,086,247 B2 | | 8/2006 | Campbell et al. |
| 7,089,752 B2 | | 8/2006 | Jeong et al. |
| 7,278,269 B2 | | 10/2007 | Pham et al. |
| 7,310,953 B2 | | 12/2007 | Pham et al. |
| 7,342,787 B1 | | 3/2008 | Bhatia |
| 7,382,047 B2 | | 6/2008 | Chen et al. |
| 7,401,472 B2 | | 7/2008 | Manole |
| 7,554,808 B2 | | 6/2009 | Scott et al. |
| 7,626,407 B2 | | 12/2009 | Kabbani |
| 7,788,937 B2 | | 9/2010 | Kawakatsu et al. |
| 7,788,941 B2 | | 9/2010 | Campbell et al. |
| 7,963,119 B2 | * | 6/2011 | Campbell et al. ............ 62/259.2 |
| 8,018,718 B2 | | 9/2011 | Goth et al. |
| 2001/0000880 A1 | * | 5/2001 | Chu et al. ............... 165/263 |
| 2002/0145439 A1 | | 10/2002 | Gaasch et al. |
| 2003/0000231 A1 | | 1/2003 | Pokharna et al. |
| 2003/0014987 A1 | | 1/2003 | Levenduski et al. |
| 2005/0122685 A1 | * | 6/2005 | Chu et al. ............... 361/699 |
| 2005/0262869 A1 | | 12/2005 | Tongu et al. |
| 2005/0262870 A1 | | 12/2005 | Narayanamurthy et al. |
| 2006/0042289 A1 | | 3/2006 | Campbell et al. |
| 2007/0044493 A1 | | 3/2007 | Kearney et al. |
| 2007/0062181 A1 | * | 3/2007 | Williamson et al. ............ 60/297 |
| 2007/0107453 A1 | * | 5/2007 | Cutting et al. ............... 62/276 |
| 2007/0199335 A1 | | 8/2007 | Innes |
| 2008/0307806 A1 | | 12/2008 | Campbell et al. |
| 2009/0038317 A1 | | 2/2009 | Otey |
| 2009/0126909 A1 | | 5/2009 | Ellsworth, Jr. et al. |
| 2009/0158768 A1 | | 6/2009 | Rafalovich et al. |
| 2010/0005820 A1 | | 1/2010 | Harig |
| 2010/0073863 A1 | | 3/2010 | Matsushima et al. |
| 2010/0079952 A1 | | 4/2010 | Liang et al. |
| 2010/0200197 A1 | | 8/2010 | Bezama et al. |
| 2011/0180241 A1 | * | 7/2011 | So et al. ............... 165/148 |
| 2011/0197612 A1 | | 8/2011 | Campbell et al. |
| 2012/0111027 A1 | | 5/2012 | Campbell et al. |
| 2012/0111028 A1 | | 5/2012 | Campbell et al. |
| 2012/0111035 A1 | | 5/2012 | Campbell et al. |
| 2012/0111036 A1 | | 5/2012 | Campbell et al. |
| 2012/0111037 A1 | | 5/2012 | Campbell et al. |
| 2012/0111038 A1 | | 5/2012 | Campbell et al. |
| 2012/0125022 A1 | | 5/2012 | Maybury et al. |
| 2012/0125573 A1 | | 5/2012 | Rubenstein et al. |
| 2012/0210731 A1 | | 8/2012 | Campbell et al. |

FOREIGN PATENT DOCUMENTS

| | | | |
|---|---|---|---|
| DE | 19903743 A1 | | 8/2000 |
| EP | 0025665 A1 | | 3/1981 |
| EP | 1031808 A2 | | 8/2000 |
| JP | 1098885 A | | 4/1989 |
| JP | 10223442 A | | 8/1998 |
| JP | 2006162246 A | | 6/2006 |
| JP | 2006-278923 A | | 10/2006 |
| JP | 2008014563 A | | 1/2008 |
| JP | 2010121930 A | * | 6/2010 |
| KR | 2005-026591 A | | 3/2005 |
| WO | WO2010017536 A2 | | 2/2010 |

OTHER PUBLICATIONS

Ellsworth, Jr. et al., "The Evolution of Water Cooling for IBM Larger Server Systems: Back to the Future", IBM Corporation, Poughkeepsie, NY (2008).

International Search Report and Written Opinion from International Application No. PCT/EP2008/055758, dated Oct. 29, 2008.

Simons, Robert E., "Application of Thermoelectric Coolers for Module Cooling Enhancement" (http://www.electronics-cooling.com/2000/05/application-of-thermoelectric-coolers-for-module-cooling-enhancement/) (May 1, 2000).

Tellurex, "An Introduction to Thermoelectrics", (http://www.tellurex.com/pdf/introduction-to-thermoelectrics.pdf) (2010).

Tellurex, "An Introduction to Temperature Control of Thermoelectric Systems", (http://www.tellurex.com/pdf/introduction-to-temperature-control.pdf) (2010).

Tellurex, "Frequently Asked Questions About Our Power Generation Technology", (http://www.tellurex.com/pdf/seebeck-faq.pdf) (2010).

Tellurex, "Frequently Asked Questions About Our Cooling and Heating Technology", (http://www.tellurex.com/pdf/peltier-faq.pdf) (2010).

Campbell et al., Office Action for U.S. Appl. No. 12/939,574, filed Nov. 4, 2010 (US. Patent Publication No. 2012/0111027 A1), dated Jun. 17, 2013 (24 pgs.).

Campbell et al., Office Action for U.S. Appl. No. 12/939,535, filed Nov. 4, 2010 (US. Patent Publication No. 2012/0111036 A1), dated Jun. 18, 2013 (19 pgs.).

Campbell et al., Final Office Action for U.S. Appl. No. 12/939,552, filed Nov. 4, 2010 (U.S. Patent Publication No. 2012/0111037 A1), dated Jul. 5, 2013 (36 pgs.).

Campbell et al., Office Action for U.S. Appl. No. 12/939,547, filed Nov. 4, 2010 (U.S. Patent Publication No. 2012-0111027 A1), dated Dec. 3, 2012.

Campbell et al., Office Action for U.S. Appl. No. 13/451,668, filed Apr. 20, 2012 (U.S. Patent Publication No. 2012-0210731 A1), dated Dec. 4, 2012.

Campbell et al., Office Action for U.S. Patent U.S. Appl. No. 12/939,552, filed Nov. 4, 2010, (U.S. Patent Publication No. 2012/0111037 A1), dated Dec. 13, 2012.

Campbell et al., Office Action for U.S. Appl. No. 12/939,569, filed Nov. 4, 2010, (U.S. Patent Publication No. 2012/0111028 A1), dated Dec. 18, 2012.

Campbell et al., Office Action for U.S. Appl. No. 12/939,535, filed Nov. 4, 2010, (U.S. Patent Publication No. 2012/0111036 A10), dated Dec. 19, 2012.

Campbell et al., Office Action for U.S. Appl. No. 12/939,546, filed Nov. 4, 2010, (U.S. Patent Publication No. 2012/0111035 A1), dated Jan. 2, 2013.

Campbell et al., Office Action for U.S. Appl. No. 12/939,563, filed Nov. 4, 2010 (U.S. Patent Publication No. 2012/0111038 A1), dated Feb. 27, 2013.

Campbell et al., Final Office Action for U.S. Appl. No. 12/939,563, filed Nov. 4, 2010 (U.S. Patent Publication No. 2012/0111038 A1), dated Oct. 22, 2013 (23 pages).

(56) References Cited

OTHER PUBLICATIONS

Campbell et al., Notice of Allowance for U.S. Appl. No. 13/451,668, filed Apr. 20, 2012 (U.S. Patent Publication No. 2012/0210731 A1), dated Sep. 20, 2013 (25 pages).

Campbell et al., Notice of Allowance for U.S. Appl. No. 12/939,574, filed Nov. 4, 2010 (U.S. Patent Publication No. 2012/0111027 A1), dated Sep. 27, 2013 (11 pgs.).

* cited by examiner

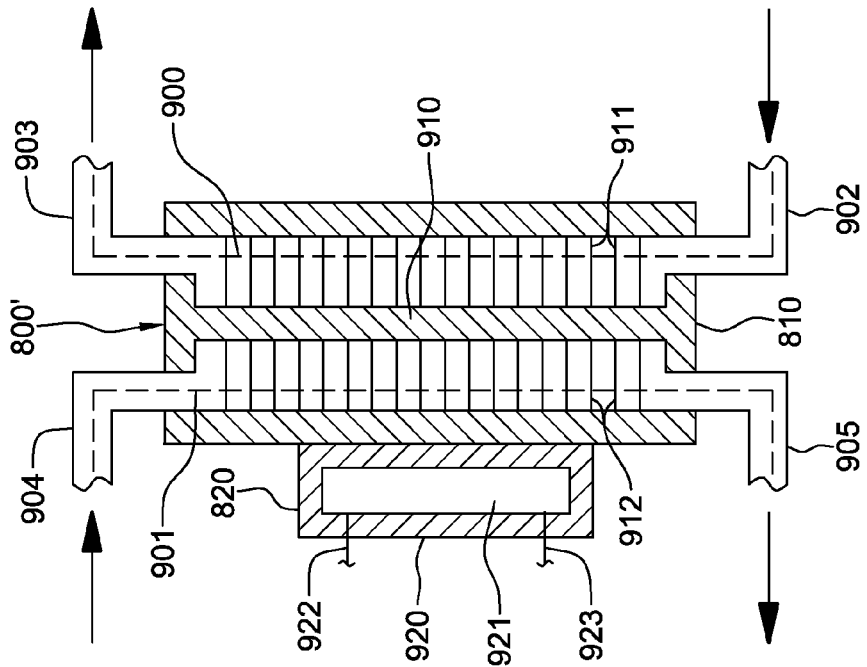
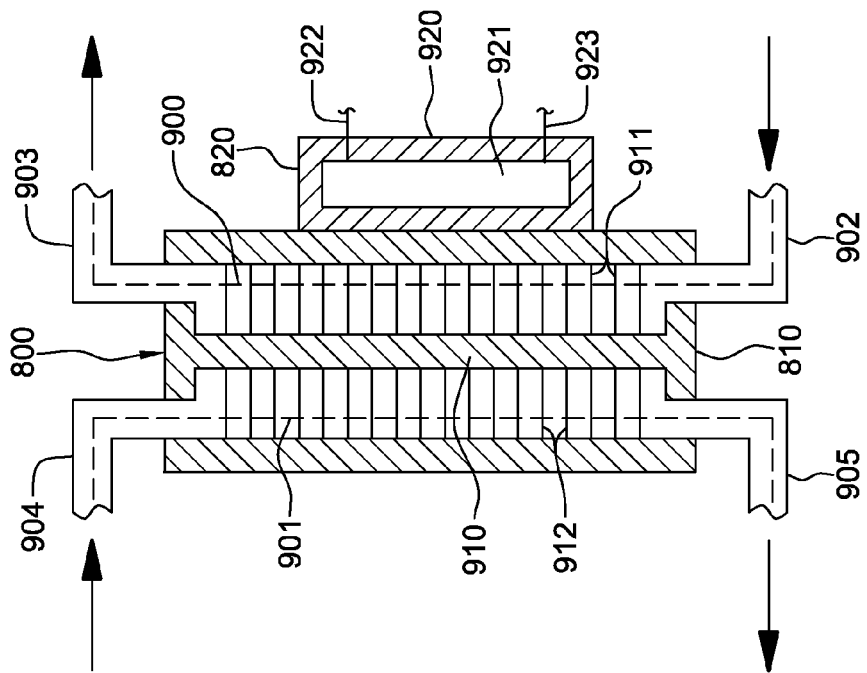
FIG. 9A
FIG. 9B

HEAT EXCHANGE ASSEMBLY WITH INTEGRATED HEATER

BACKGROUND

The present invention relates to heat transfer mechanisms, and more particularly, to cooling apparatuses, liquid-cooled electronics racks and methods of fabrication thereof for removing heat generated by one or more electronic components of the electronics rack.

The power dissipation of integrated circuit chips, and the modules containing the chips, continues to increase in order to achieve increases in processor performance. This trend poses a cooling challenge at both the module and system levels. Increased airflow rates are needed to effectively cool higher power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device(s) or by increasing the rotational speed (i.e., RPMs) of an existing air moving device. However, this approach is becoming problematic at the rack level in the context of a data center.

BRIEF SUMMARY

In one aspect, the shortcomings of the prior art are overcome and additional advantages are provided through the provision of a heat exchange assembly. The heat exchange assembly includes a coolant-to-refrigerant heat exchanger and a heater. The coolant-to-refrigerant heat exchanger comprises a coolant inlet and a coolant outlet for passing a coolant therethrough, and a refrigerant inlet and a refrigerant outlet for separately passing a refrigerant therethrough. The coolant-to-refrigerant heat exchanger cools coolant passing therethrough by dissipating heat from the coolant passing therethrough to the refrigerant passing therethrough. The heater is integrated with the coolant-to-refrigerant heat exchanger for applying an auxiliary heat load to refrigerant passing through the coolant-to-refrigerant heat exchanger. The heater facilitates ensuring that refrigerant passing through the coolant-to-refrigerant heat exchanger absorbs at least a specified minimum heat load.

In another aspect, an apparatus for facilitating cooling of an electronic component is provided. The apparatus includes: a coolant-cooled structure, a coolant loop, a refrigerant loop and a heat exchange assembly. The coolant-cooled structure is in thermal communication with the electronic component and the coolant loop is in fluid communication with the coolant-cooled structure. The heat exchange assembly comprises a coolant-to-refrigerant heat exchanger, and a heater. The coolant-to-refrigerant heat exchanger includes a coolant inlet and a coolant outlet coupled in fluid communication with the coolant loop, and a refrigerant inlet and a refrigerant outlet coupled in fluid communication with the refrigerant loop. The heat exchanger cools coolant passing therethrough by dissipating heat from the coolant passing therethrough to refrigerant passing therethrough. The heater is integrated with the coolant-to-refrigerant heat exchanger for applying an auxiliary heat load to refrigerant passing through the coolant-to-refrigerant heat exchanger to ensure that refrigerant passing through the coolant-to-refrigerant heat exchanger absorbs at least a specified minimum heat load.

In a further aspect, a method of facilitating cooling of an electronic component is provided. The method includes: coupling in thermal communication a coolant-cooled structure to the electronic component; providing a coolant loop in fluid communication with the coolant-cooled structure; providing a coolant-to-refrigerant heat exchanger in fluid communication with the coolant-cooled structure via the coolant loop to receive coolant therefrom and provide coolant thereto; providing a refrigerant loop in fluid communication with the coolant-to-refrigerant heat exchanger, the coolant-to-refrigerant heat exchanger being configured to cool coolant passing therethrough by dissipating heat from the coolant passing therethrough to refrigerant passing therethrough; and integrating a heater in thermal communication with the coolant-to-refrigerant heat exchanger, the heater applying an auxiliary heat load to refrigerant passing through the coolant-to-refrigerant heat exchanger for facilitating ensuring that refrigerant passing through the coolant-to-refrigerant heat exchanger absorbs at least a specified minimum heat load.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9A is a cross-sectional plan view of one embodiment of a heat exchange assembly comprising a coolant-to-refrigerant heat exchanger and an integrated heater for, for example, a coolant-buffered, vapor-compression refrigeration apparatus such as depicted in FIG. 8, in accordance with an aspect of the present invention;

FIG. 9B is a cross-sectional plan view of an alternate embodiment of a heat exchange assembly for, for example, the coolant-buffered, vapor-compression refrigeration apparatus of FIG. 8, in accordance with an aspect of the present invention;

DETAILED DESCRIPTION

Figure 1:
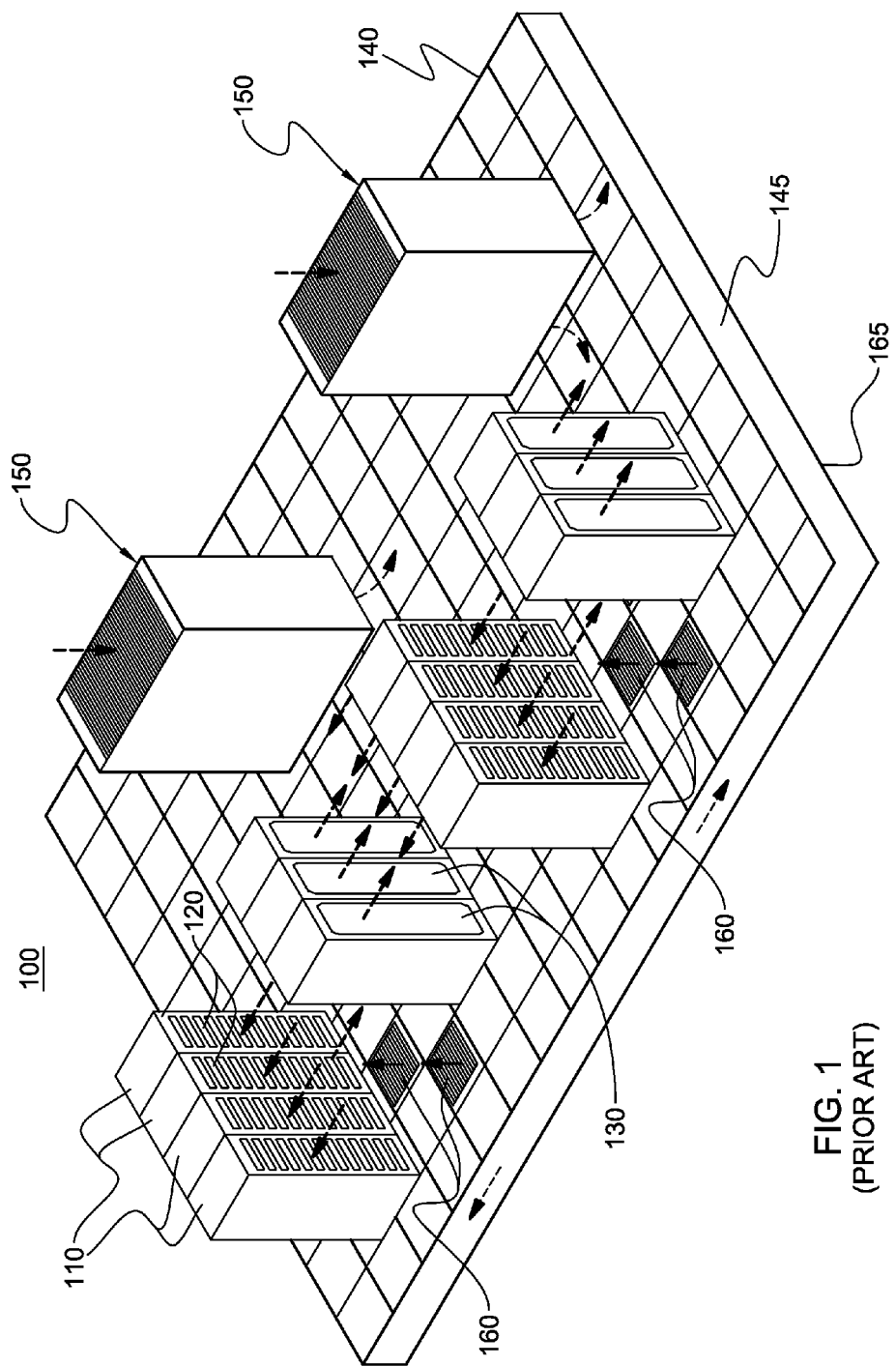
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the term "liquid-cooled cold plate" refers to any thermally conductive structure having a plurality of channels (or passageways) formed therein for flowing of liquid coolant therethrough. A "coolant-cooled structure" may comprise, in one example, a liquid-cooled cold plate. Alternatively, when used in combination with a dielectric coolant, the liquid-cooled structure may comprise a sealed housing surrounding the electronic component to be cooled, for example, by immersion-cooling within the dielectric coolant.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein. A "fluid-to-fluid heat exchanger" may comprise, for example, two or more separate coolant flow paths, formed of thermally conductive tubings (such as copper or other tubing) in thermal communication with each other. Size, configuration and construction of the fluid-to-fluid heat exchanger can vary without departing from the scope of the invention disclosed herein. In one embodiment, a "coolant-to-refrigerant heat exchanger" is a type of fluid-to-fluid heat exchanger, wherein the first fluid is a coolant and the second fluid a refrigerant, either or both of which may be in vapor phase when passing through the heat exchanger. Structurally, the coolant-to-refrigerant heat exchanger is analogous to a fluid-to-fluid heat exchanger, only constructed for the particular application described herein.

Unless otherwise specified, "refrigerant evaporator" refers to the heat-absorbing mechanism or structure within a refrigeration loop. The refrigerant evaporator is alternatively referred to as a "sub-ambient evaporator" when temperature of the refrigerant passing through the refrigerant evaporator is below the temperature of ambient air entering the electronics rack. In one example, the refrigerant evaporator comprises a coolant-to-refrigerant heat exchanger. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

As used herein, the phrase "controllable coolant heater" refers to an adjustable heater which allows active control of an auxiliary heat load applied to coolant passing through the coolant loop of a cooling apparatus, such as described herein. In one example, the controllable coolant heater comprises one or more electrical resistance elements in thermal communication with the coolant passing through the coolant loop and powered by an electrical power source.

One example of the coolant employed in the examples below is water. However, the concepts disclosed herein are readily adapted to use with other types of coolant. For example, the coolant may comprise a dielectric liquid, a fluorocarbon liquid, a Fluorinert™ liquid, a liquid metal, a brine, or other similar coolant, while still maintaining the advantages and unique features of the present invention. One example of the refrigerant employed in the examples below is R134a refrigerant. Other examples of refrigerant which may be employed include R245fa, R404, R12 or R22 refrigerant.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
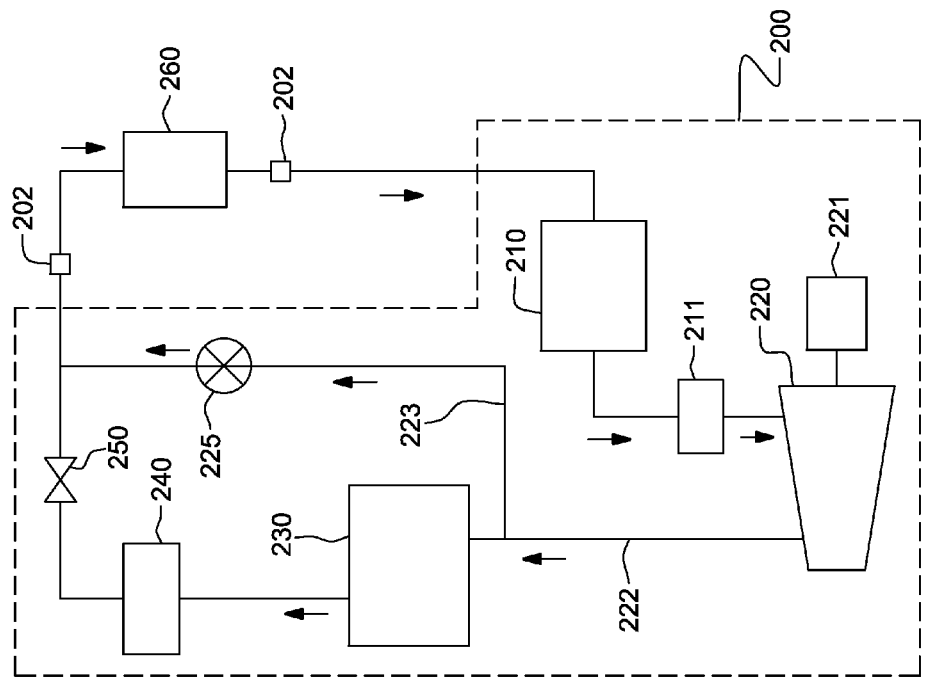
FIG. 2B is a schematic of one embodiment of a vapor-compression refrigeration system for cooling an evaporator (or cold plate) coupled to a high heat flux electronic component (e.g., module) to be cooled, in accordance with an aspect of the present invention.
Figure 2A:
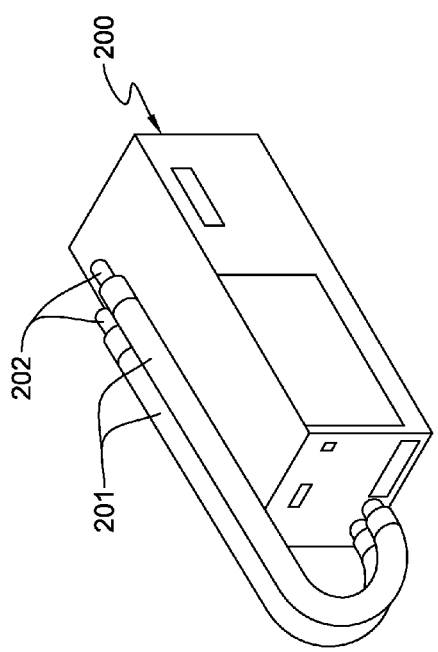
FIG. 2A is an isometric view of one embodiment of a modular refrigeration unit (MRU) and its quick connects for attachment to a cold plate and/or evaporator disposed within an electronics rack to cool one or more electronic components (e.g., modules) thereof, in accordance with an aspect of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
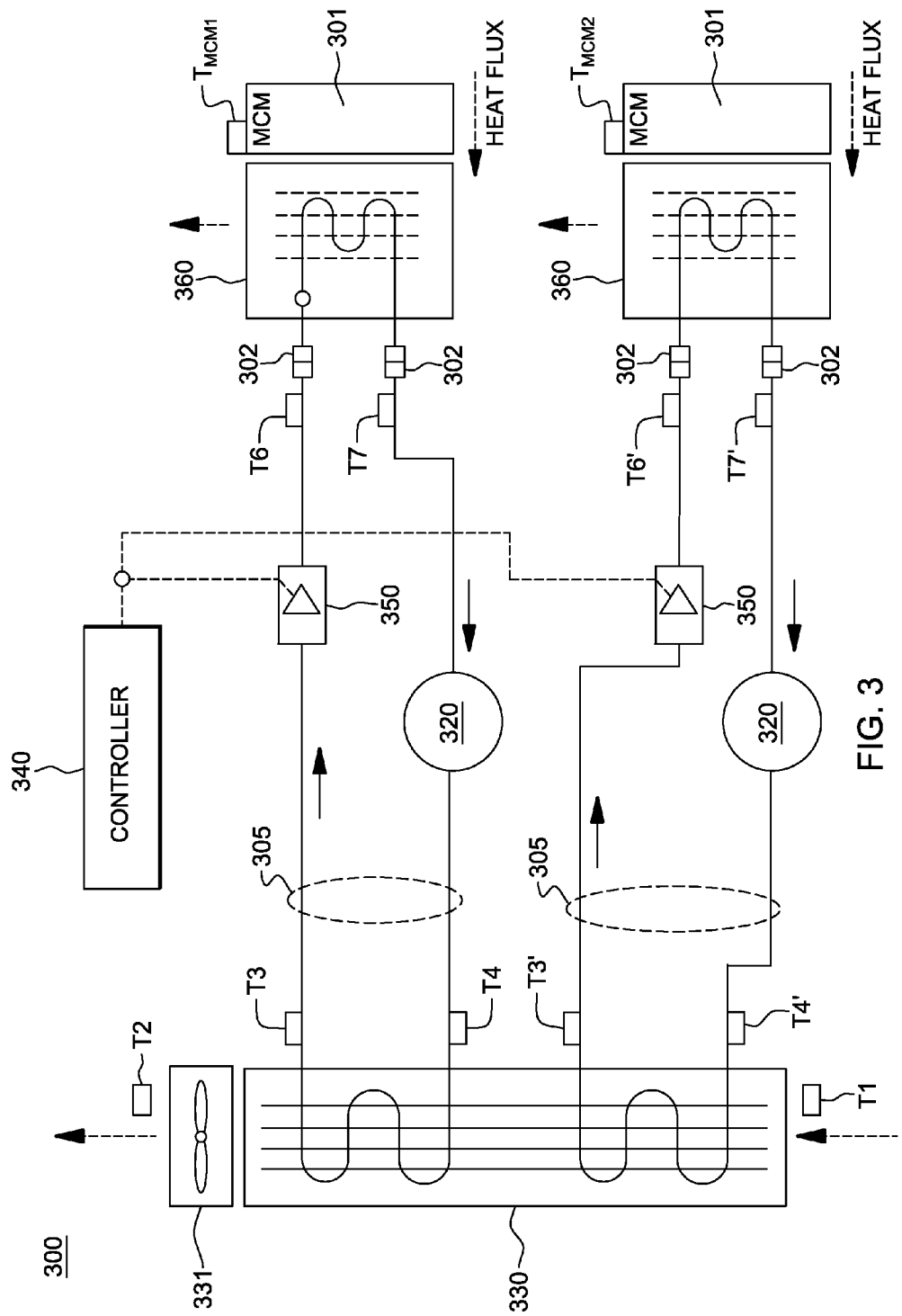
FIG. 3 is an schematic of an alternate embodiment of a vapor-compression refrigeration system for cooling multiple evaporators coupled to respective electronic components to be cooled, in accordance with an aspect of the present invention.

FIG. 3 depicts an alternate embodiment of a modular refrigeration unit 300, which may be employed within an electronics rack, in accordance with an aspect of the present invention. Modular refrigeration unit 300 includes (in this example) two refrigerant loops 305, or i.e., sets of refrigerant supply and exhaust hoses, coupled to respective refrigerant evaporators (or cold plates) 360 via quick connect couplings 302. Each refrigerant evaporator 360 is in thermal communication with a respective electronic component 301 (e.g., multichip module (MCM)) for facilitating cooling thereof. Refrigerant loops 305 are independent, and shown to include a compressor 320, a respective condenser section of a shared condenser 330 (i.e., a refrigerant-to-air heat exchanger), and an expansion (and flow control) valve 350, which is employed to maintain temperature of the electronic component at a steady temperature level, e.g., 29° C. In one embodiment, the expansion valves 350 are controlled by the temperature of the respective electronic component 301 $T_{MCM1}$, $T_{MCM2}$. The refrigerant and coolant loops may also contain further sensors, such as sensors for condenser air temperature IN T1, condenser air temperature OUT T2, temperature T3, T3' of high-pressure liquid refrigerant flowing from the condenser 330 to the respective expansion valve 350, temperature T4, T4' of high-pressure refrigerant vapor flowing from each compressor 320 to the respective condenser section 330, temperature T6, T6' of low-pressure liquid refrigerant flowing from each expansion valve 350 into the respective evaporator 360, and temperature T7, T7' of low-pressure vapor refrigerant flowing from the respective evaporator 360 towards the compressor 320. Note that in this implementation, the expansion valves 350 operate to actively throttle the pumped refrigerant flow rate, as well as to function as expansion orifices to reduce the temperature and pressure of refrigerant passing through it.

In situations where electronic component 301 temperature decreases (i.e., the heat load decreases), the respective expansion valve 350 is partially closed to reduce the refrigerant flow passing through the associated evaporator 360 in an attempt to control temperature of the electronic component. If temperature of the component increases (i.e., heat load increases), then the controllable expansion valve 350 is opened further to allow more refrigerant flow to pass through the associated evaporator, thus providing increased cooling to the component. In extreme conditions, there is the possibility of too much refrigerant flow being allowed to pass through the evaporator, possibly resulting in partially-evaporated fluid, (i.e., liquid-vapor mixture) being returned to the respective compressor, which can result in compressor valve failure due to out-of-specification pressures being imposed on the compressor valve. There is also the possibility of particulate and chemical contamination over time resulting from oil breakdown inside the loop accumulating within the controllable expansion valve. Accumulation of contamination within the valve can lead to both valve clogging and erratic valve behavior.

Figure 4:
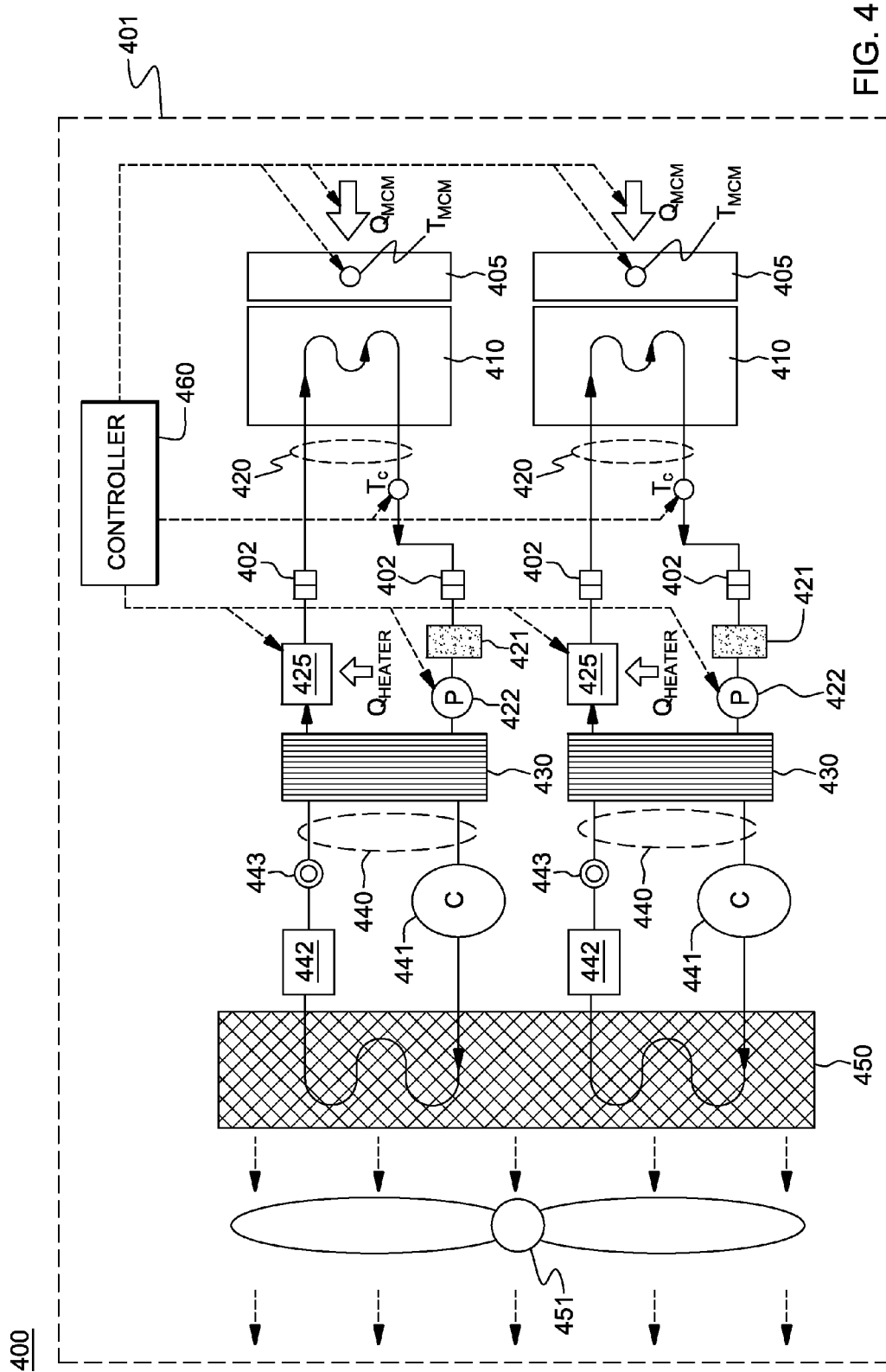
FIG. 4 is a schematic of one embodiment of a coolant-buffered, vapor-compression refrigeration apparatus for cooling one or more evaporators coupled to respective electronic components to be cooled, in accordance with an aspect of the present invention.

In accordance with another aspect of the present invention, FIG. 4 depicts an alternate implementation of a cooling apparatus which does not require a mechanical flow control and adjustable expansion valve, such as described above in connection with the modular refrigeration unit of FIG. 3, and which ensures that the refrigerant fluid enters the compressor of the vapor-compression refrigeration subsystem in a superheated thermodynamic state. In the embodiment of FIG. 4, a dual loop, cooled electronic system is depicted by way of example. However, those skilled in the art should note that the cooling apparatus depicted therein and described below can be readily configured for cooling a single electronic component, or a plurality of electronic components (either with our without employing a shared condenser, as in the example of FIG. 4).

As shown in FIG. 4, cooled electronic system 400 includes an electronics rack 401 which comprises multiple electronic components 405 to be cooled. By way of specific example, each electronic component 405 to be cooled by the cooling apparatus may be a multichip module (MCM), such as a processor MCM. In the illustrated implementation, the apparatus is a coolant-buffered, vapor-compression refrigeration apparatus with a controlled coolant heat load. Coolant buffering is achieved by associating a coolant-cooled structure 410 with the respective electronic component 405 to be cooled. A coolant loop 420 is coupled in fluid communication with coolant-cooled structure 410 to allow for the ingress and egress of coolant through the structure, and quick connect couplings 402 facilitate coupling of coolant-cooled structure 410 to the balance of the respective cooling apparatus. Each coolant loop 420 is also in fluid communication with a coolant reservoir 421, a coolant pump 422 (which may be adjustable, depending on the implementation), and a coolant-to-refrigerant heat exchanger 430. In addition, a respective controllable coolant heater 425 is in thermal communication with the coolant in the coolant loop 420 for controllably applying a heat load thereto, as described further below. In one example, coolant flowing through coolant loop 420 is water, however, as noted above, other coolants may alternatively be employed. If a dielectric coolant is employed, then liquid-cooled structure 410 may comprise a sealable housing, which facilitates immersion-cooling of electronic component 405.

Each respective vapor-compression refrigeration subsystem of the cooling apparatus includes a refrigerant loop 440 in fluid communication with coolant-to-refrigerant heat exchanger 430, a compressor 441, a condenser section passing through a shared condenser 450, a filter/dryer 442, and a fixed orifice expansion valve 443. As illustrated, an air-moving device 451 facilitates air flow across shared condenser 450. Note that, in an alternate implementation, each vapor-compression refrigeration subsystem of the cooling apparatus could incorporate its own condenser and air-moving device.

A controller 460 is provided coupled in communication with the controllable coolant heaters 425 and, dependent upon the implementation, coolant pumps 422 (e.g., if the coolant pumps are variable speed), coolant temperature sensors $T_C$, MCM heat load sensors $Q_{MCM}$, and MCM temperature sensors $T_{MCM}$, as described below with reference to the control processes of FIGS. 5-7. Each controllable coolant heater 425 is associated and in thermal communication with a respective coolant loop 420 to apply a controlled heat load to coolant in the coolant loop to ensure that the coolant passing through coolant-to-refrigerant heat exchanger 430 dissipates at least a minimum heat load to refrigerant passing through the coolant-to-refrigerant heat exchanger. The one or more controllable coolant heaters 425 associated with each coolant loop 420 allow the heat load to be dissipated within the heat exchanger 430 to be held substantially constant, for example, within a narrow range of values, by reacting to variation in the electronic component 405 heat load $Q_{MCM}$ over time.

In operation, each electronic component 405 applies a heat load $Q_{MCM}$ to coolant passing through liquid-cooled structure 410. Coolant pump 422 (which may or may not comprise an adjustable speed control) circulates coolant through coolant loop 420. Refrigerant loop 440 absorbs the heat load from the coolant passing through heat exchanger 430 and rejects this heat to an air stream via air-cooled condenser 450. Advantageously, by ensuring that coolant passing through heat exchanger 430 dissipates at least a minimum heat load to the refrigerant, compressor 441 within refrigerant loop 440 can work at a fixed speed, and a fixed orifice 443 can be used within refrigerant loop 440 as an expansion valve for the vapor-compression refrigeration loop. The application of an adjustable, auxiliary heat load by the controllable coolant heater 425 to the coolant means that the desired, minimum heat load can be maintained at the refrigeration loop, and by prespecifying this minimum heat load, superheated refrigerant can be guaranteed to enter the compressor, allowing for a reliable design of the vapor-compression refrigeration subsystem. Further, by maintaining a specified heat load condition, a fixed orifice can be used in lieu of the controllable expansion valve described above in connection with the implementation of FIG. 3. The controllable coolant heater 425 can be controlled using a variety of approaches, with various thermal measurements being employed and transmitted to the controller to incrementally adjust the heat load being applied by the coolant heater to the circulating coolant.

Advantageously, the use of a cooling apparatus such as depicted in FIG. 4 addresses electronic component heat load changes by maintaining a specified heat load at the refrigerant loop. The controllable coolant heater may be controlled based, for example, on current heat load provided by the electronic component, or current temperature of the electronic component or temperature of coolant within the coolant loop. Further, within the cooling apparatus the refrigerant loop may be hard-plumbed, and a constant speed compressor may be advantageously employed, along with a fixed expansion orifice. This enables a minimum amount of controls on the refrigeration loop side of the apparatus. The resultant cooling apparatus can be packaged inside a modular refrigeration unit-like subassembly, such as depicted in connection with FIG. 2A.

Figure 5A:
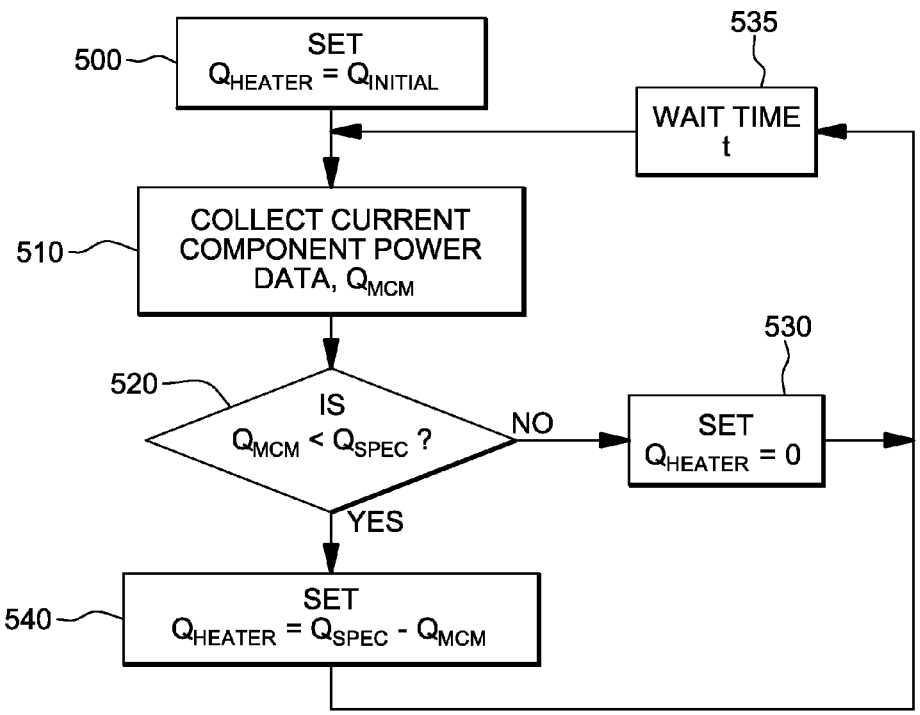
FIG. 5A is a flowchart of one embodiment of a process for ensuring that at least a minimum heat load is dissipated to refrigerant passing through the coolant-to-refrigerant heat exchanger of the cooling apparatus of FIG. 4, in accordance with an aspect of the present invention.
Figure 5B:
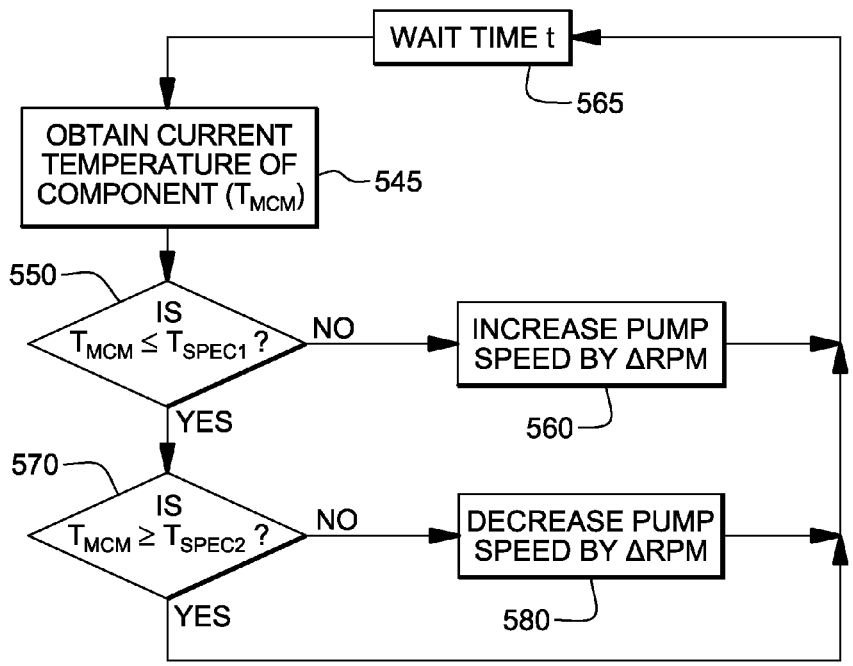
FIG. 5B is a flowchart of one embodiment of a process for maintaining a monitored temperature of the electronic component being cooled within a specified temperature range using the cooling apparatus of FIG. 4, in accordance with an aspect of the present invention.

FIGS. 5A & 5B depict one embodiment of control processes for ensuring a specified heat load at the refrigerant loop, while maintaining electronic component temperature within a specified temperature range.

Referring first to FIG. 5A, substantially constant refrigerant loop loading is established by first setting the heat load applied to the coolant by the controllable coolant heater ($Q_{HEATER}$) equal to an initial (or nominal) heat load value ($Q_{INITIAL}$) 500. The current component heat load (e.g., power data) is collected 510. If the MCM heat load ($Q_{MCM}$) is less than the desired, specified heat load ($Q_{SPEC}$) 520, then the controllable coolant heater is reset to apply a heat load ($Q_{HEATER}$), which matches the difference 540. Otherwise, the heat load applied by the controllable coolant heater is set to zero 530. After adjusting the heat load, processing waits time t 535 before repeating the loop by again collecting current component heat load data ($Q_{MCM}$) 510.

Concurrent with the processing of FIG. 5A, in those apparatus embodiments comprising a variable speed pump, speed of the pump may be varied to ensure that electronic component temperature is maintained within a specified temperature range between, for example, a first specified temperature ($T_{SPEC1}$) and a second specified temperature ($T_{SPEC2}$), wherein $T_{SPEC1}$ is higher than $T_{SPEC2}$. In the process illustrated in FIG. 5B, current MCM temperature ($T_{MCM}$) is obtained 545 and processing determines whether the current component temperature ($T_{MCM}$) is less than or equal to the first specified temperature ($T_{SPEC1}$) 550. If the component temperature ($T_{MCM}$) is above the first specified temperature ($T_{SPEC1}$), then speed of the adjustable coolant pump is increased by a defined value (ΔRPM) 560, after which processing waits time t 565 before again obtaining the current temperature of the component ($T_{MCM}$) 545. If component temperature ($T_{MCM}$) is less than or equal to the first specified temperature ($T_{SPEC1}$) 550, then processing determines whether component temperature ($T_{MCM}$) is greater than or equal to a second specified temperature ($T_{SPEC2}$) 570. If not, then processing decreases pump speed of the adjustable coolant pump by a set amount (ΔRPM) 580, and repeats the loop after waiting time t 565. If component temperature ($T_{MCM}$) is less than or equal to the first specified temperature value ($T_{SPEC1}$), and greater than or equal to the second specified temperature value ($T_{SPEC2}$), then component temperature is within the specified temperature range, and processing waits time t 565 before again obtaining a current temperature of the component ($T_{MCM}$). Note that the processing of FIG. 5B advantageously accounts for variability in coolant-cooled structure construction and thermal interface resistance, both of which can vary due to manufacturing variability, or in the case of the thermal interface material, can change over time (for example, if the thermal interface material degrades).

Figure 6:
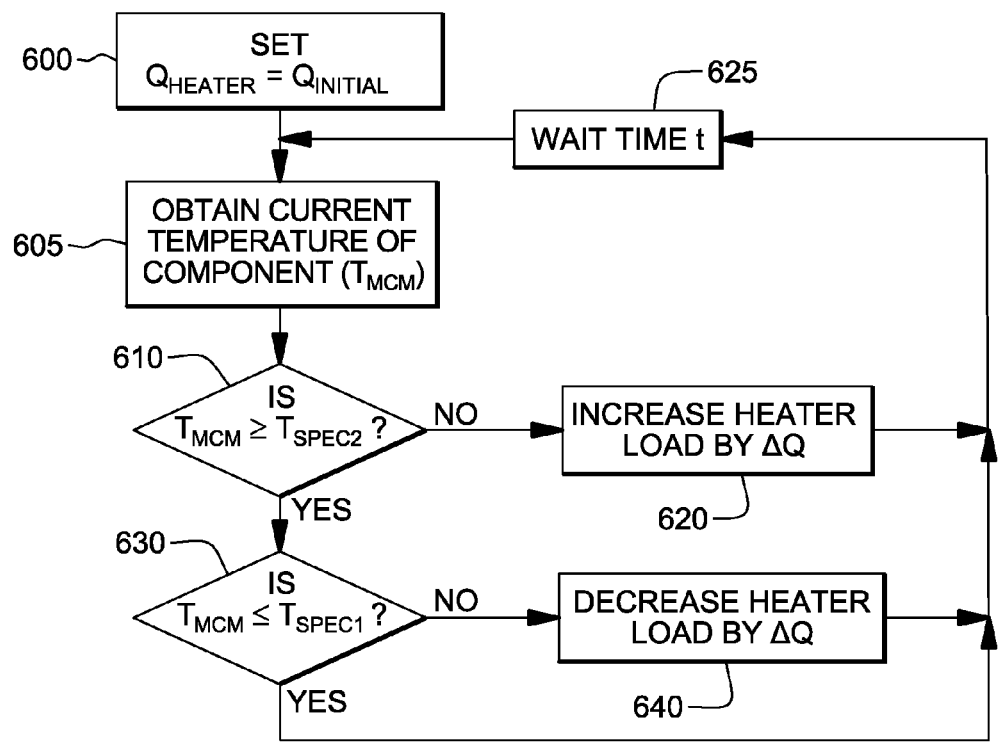
FIG. 6 is a flowchart of another embodiment of a process for ensuring that at least the minimum heat load is dissipated to refrigerant passing through the coolant-to-refrigerant heat exchanger of the cooling apparatus of FIG. 4, in accordance with an aspect of the present invention.

FIG. 6 illustrates an alternate embodiment of control processing for the cooling apparatus of FIG. 4. This approach does not require a variable speed coolant pump, or knowledge of the heat load applied by the electronic component. Rather, only knowledge of the electronic component temperature ($T_{MCM}$) is employed, along with a first specified temperature ($T_{SPEC1}$) and a second specified temperature ($T_{SPEC2}$), wherein $T_{SPEC1}$ is higher than $T_{SPEC2}$. Initially, the controller sets the heat load applied by the controllable coolant heater ($Q_{HEATER}$) equal to an initial (or nominal) value ($Q_{INITIAL}$) 600. The component temperature ($T_{MCM}$) is then obtained 605 and compared against the second specified temperature value ($T_{SPEC2}$) to determine if it is equal to or above this second specified value 610. (Note that in this processing example, $T_{SPEC1}$ and $T_{SPEC2}$ are different specified temperatures compared with the processing example of FIG. 5B.) If not, heat load applied by the controllable coolant heater is increased by a set amount (ΔQ) 620, after which processing waits a time t 625 before obtaining the then current temperature of the component ($T_{MCM}$) and repeating the process. If the current component temperature ($T_{MCM}$) is less than the second specified temperature ($T_{SPEC2}$), then processing determines whether the current component temperature ($T_{MCM}$) is less than or equal to the first specified temperature ($T_{SPEC1}$) 630. If "no", then heat load applied by the controllable coolant heater is decreased 640, after which processing waits time t 625 before again obtaining the current temperature of the component ($T_{MCM}$) 605.

Thus, with the processing of FIG. 6, and using the auxiliary, controllable coolant heater, the component temperature is controlled to be within a specified temperature range (i.e., between $T_{SPEC1}$ and $T_{SPEC2}$). Since the pump flow rate is assumed to be constant, this control translates into a constant heat load on the refrigerant loop. The actual value of the loading may change from loop to loop based (for example) on the exact value of the electronic component to coolant inlet thermal resistance. As noted, the coolant-cooled structure and interface thermal resistance can vary due to manufacturing variability, and can change over time if thermal interface material degrades. Ultimately, the heat load dissipated to the refrigerant loop will be within a certain range that can be designed towards using a fixed compressor speed and a fixed orifice opening as expansion valve for the refrigerant loop.

Figure 7:
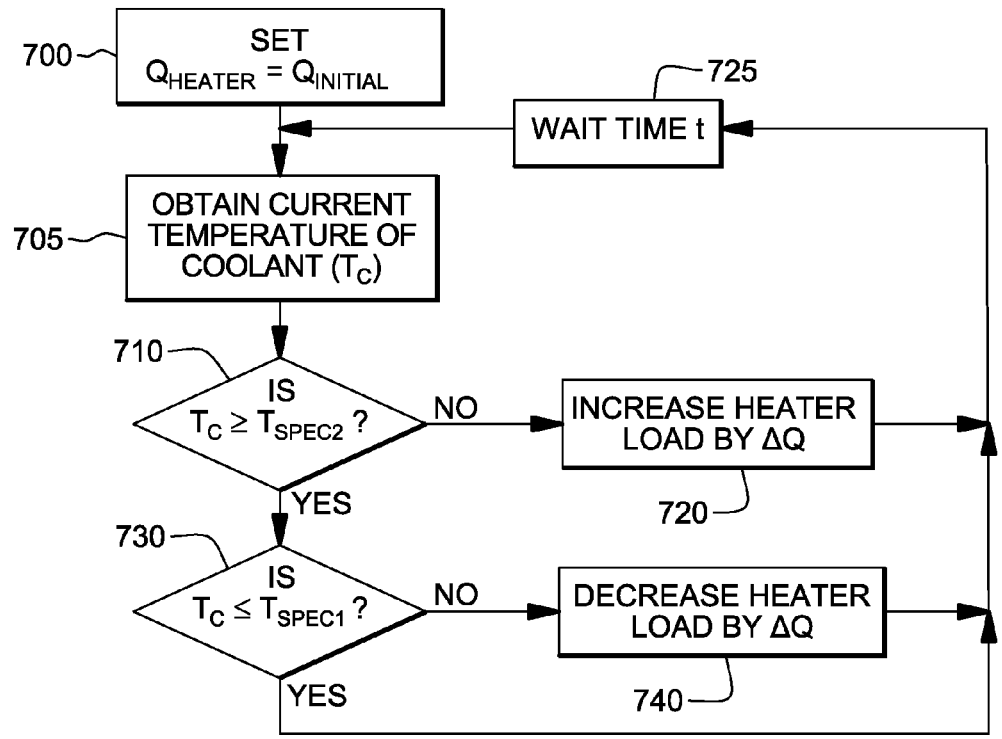
FIG. 7 is a flowchart of a further embodiment of a process for ensuring that at least the minimum heat load is dissipated to refrigerant passing through the coolant-to-refrigerant heat exchanger of the cooling apparatus of FIG. 4, in accordance with an aspect of the present invention.

FIG. 7 illustrates an alternate embodiment of processing for controlling the cooling apparatus depicted in FIG. 4. In this approach, a variable speed coolant pump speed is again not required, nor is knowledge of the component heat load or component temperature. Rather, only knowledge of coolant temperature ($T_C$) within the coolant loop is employed, along with a first specified temperature ($T_{SPEC1}$) and a second specified temperature ($T_{SPEC2}$), wherein $T_{SPEC1}$ is higher than $T_{SPEC2}$. Processing initially sets the heat load of the controllable coolant heater ($Q_{HEATER}$) to an initial (or nominal) value ($Q_{INITIAL}$) 700, and then obtains temperature of the coolant ($T_C$) within the coolant loop 705 (for example, at the output of the coolant-cooled structure 410, as illustrated in FIG. 4). Based on the knowledge of a constant design pump flow rate, this coolant temperature is compared with the second specified coolant temperature ($T_{SPEC2}$) to determine if heat load in the coolant loop is commensurate with the specified refrigerant loop loading. (As in the above processing example, $T_{SPEC1}$ and $T_{SPEC2}$ are different specified temperatures compared with the processing examples of FIGS. 5B & 6. In addition, ΔQ in FIGS. 6 & 7 may be different.)

If coolant temperature ($T_C$) is less than the second specified temperature value ($T_{SPEC1}$) 710, then processing increases the heat load applied by the controllable coolant heater to the circulating coolant by a specified amount ($\Delta Q$) 720, after which processing waits a time t 725 before obtaining a then-current temperature of the coolant ($T_C$). Assuming that the coolant temperature ($T_C$) is greater than or equal to the second specified temperature ($T_{SPEC2}$) 710, then processing determines whether coolant temperature ($T_c$) is less than or equal to the first specified coolant temperature ($T_{SPEC1}$) 730, and if not, decreases the heater load by $\Delta Q$ 740. After decreasing the heat load applied by the controllable coolant heater to the circulating coolant, or if the coolant temperature ($T_C$) is below the first specified coolant temperature ($T_{SPEC1}$) (that is, is within the temperature range between the first specified temperature ($T_{SPEC1}$) and the second specified temperature ($T_{SPEC2}$)), then processing waits time t 725, before obtaining a next, current temperature of the coolant ($T_C$) and repeating the loop. In this manner, using only coolant temperature (for example, at the outlet of the coolant-cooled structure), loading on the refrigerant loop can be maintained at a specified, constant value (or more particularly, at or above a specified minimum heat load).

Figure 8:
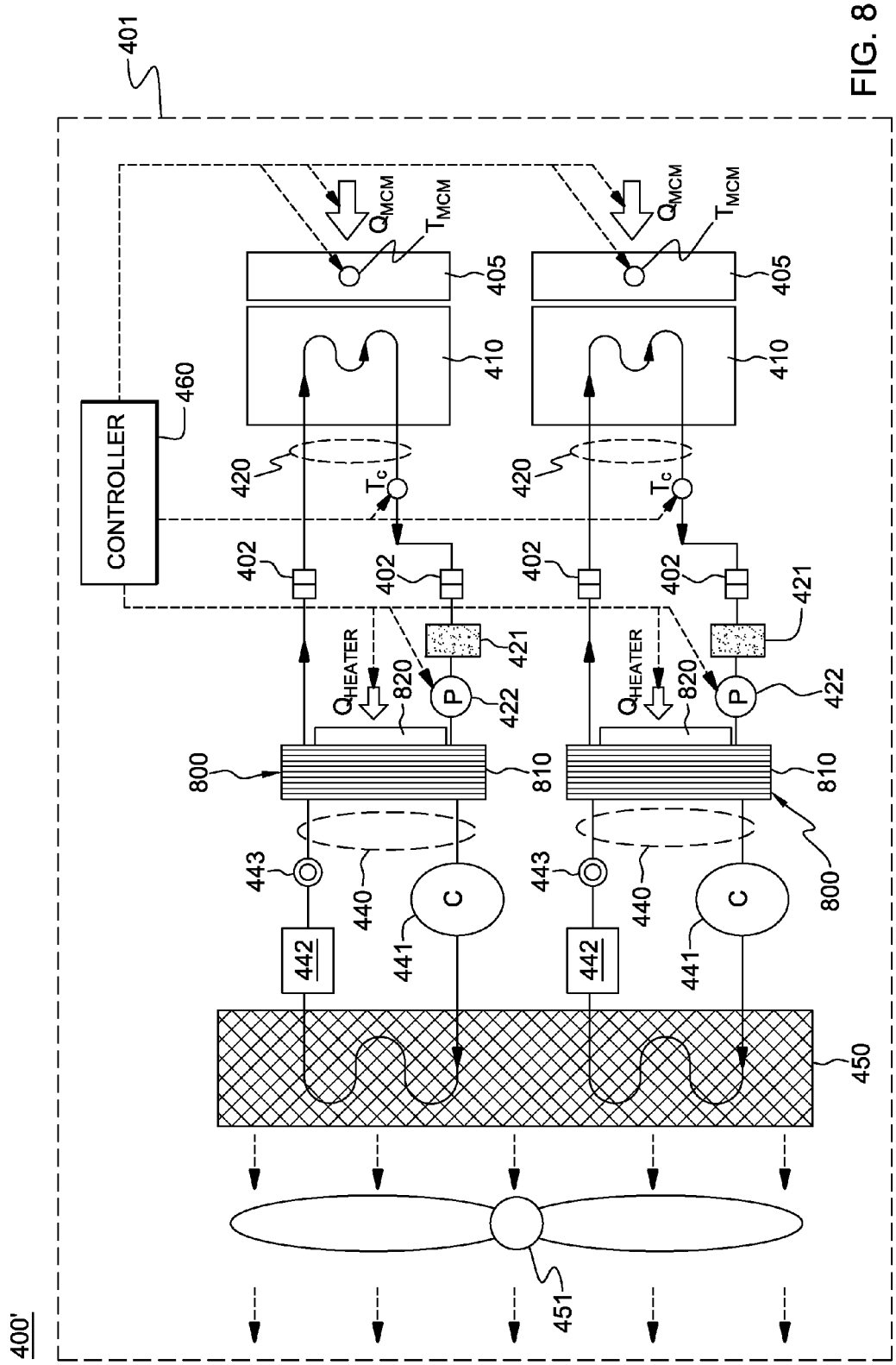
FIG. 8 is a schematic of another embodiment of a coolant-buffered, vapor-compression refrigeration apparatus for cooling one or more evaporators coupled to electronic components to be cooled, in accordance with an aspect of the present invention.

In accordance with another aspect of the present invention, FIG. 8 depicts an alternate implementation of a coolant-buffered, vapor-compression refrigeration apparatus such as described above in connection with FIG. 4. Advantageously, this alternate implementation also ensures that refrigerant fluid entering the compressor of the vapor-compression refrigeration subsystem is in a superheated thermodynamic state. In FIG. 8, a dual loop, cooled electronic system is again depicted by way of example only. Those skilled in the art will note that the heat exchange assembly and the cooling apparatus depicted therein and described below can be readily configured for cooling a single electronic component, or a plurality of electronic components (either with or without employing a shared condenser, as in the example of FIG. 8).

In FIG. 8, cooled electronic system 400' is substantially identical to cooled electronic system 400 described above in connection with FIG. 4, with two notable exceptions. First, the coolant-to-refrigerant heat exchanger 430 of the implementation of FIG. 4 is replaced with a heat exchange assembly 800, which comprises a coolant-to-refrigerant heat exchanger 810 and one or more heaters 820 integrated therewith. The heaters 820 are each associated with and in thermal communication with a respective coolant-to-refrigerant heat exchanger 810 and apply a controllable, auxiliary heat load to refrigerant passing through the respective coolant-to-refrigerant heat exchanger 810. The one or more heaters 820 integrated with a given coolant-to-refrigerant heat exchanger 810 allow the total heat load transferred by the heat exchanger 810 to be held substantially constant, for example, within a narrow range of values, by reacting to variation in the electronic component 405 heat load $Q_{MCM}$ over time. Controller 460 is coupled in communication with heaters 820 and, depending on the implementation, is coupled to coolant pumps 422 (e.g., if the coolant pumps are variable speed), coolant temperature sensors Tc, MCM heat load sensors $Q_{MCM}$, and MCM temperature sensors $T_{MCM}$, as described above with reference to the control processes of FIGS. 5-7.

In operation, an electronic component 405 applies a heat load $Q_{MCM}$ to coolant passing through the respective liquid-cooled structure 410. Coolant pump 422 (which may or may not comprise an adjustable speed control) circulates coolant through coolant loop 420. Refrigerant loop 440 absorbs the heat load from the coolant passing through heat exchanger 810, as well as the auxiliary heat load $Q_{HEATER}$ applied by heater(s) 820, and rejects this heat to an air stream via air-cooled condenser 450. Advantageously, by ensuring that refrigerant passing through heat exchange assembly 800 absorbs at least a specified minimum heat load, compressor 441 within refrigerant loop 440 can work at a fixed speed, and a fixed orifice 443 can be used within refrigerant loop 440 as an expansion valve for the vapor-compression refrigeration loop. The application of an adjustable, auxiliary heat load by the heater(s) 820 to the refrigerant means that the desired, minimum heat load can be maintained at the refrigerant loop, and by prespecifying this minimum heat load, superheated refrigerant can be ensured to enter the compressor, allowing for reliable operation of the vapor-compression refrigeration subsystem. Further, by maintaining a specified heat load condition, a fixed orifice can be used in lieu of the controllable expansion valve described above in connection with the implementation of FIG. 3. The heater(s) can be controlled using a variety of approaches, with various thermal measurements being employed and transmitted to the controller to incrementally adjust the auxiliary heat load being applied by the heater(s) integrated with the respective heat exchanger.

As with the cooling apparatus embodiment of FIG. 4, the cooling apparatus depicted in FIG. 8 advantageously addresses electronic component heat load changes by maintaining a specified heat load at the refrigerant loop. The heater(s) 820 is integrated with the coolant-to-refrigerant heat exchanger 810 and may be controlled based, for example, on current heat load dissipated by the electronic component, or current temperature of the electronic component, or temperature of coolant within the coolant loop. Further, within the cooling apparatus, the coolant loop and refrigerant loop may be hard-plumbed, and a constant speed compressor may be advantageously employed, along with a fixed expansion orifice. This enables a minimum amount of controls on the refrigeration loop side of the apparatus. The resultant cooling apparatus can be packaged inside a modular refrigeration unit-like subassembly, such as depicted in connection with FIG. 2A.

FIG. 9A depicts in cross-sectional plan view one embodiment of a heat exchange assembly 800, in accordance with the present invention. As illustrated, heat exchange assembly 800 comprises a coolant-to-refrigerant heat exchanger 810 with separate coolant flow path(s) 900 and refrigerant flow path(s) 901. The depicted coolant-to-refrigerant heat exchanger 810 is one example of a fluid-to-fluid heat exchanger, wherein a thermally conductive heat exchange plate 910 separates coolant flow path(s) 900 and refrigerant flow path(s) 901 through the heat exchanger. The coolant side of the heat exchanger is shown to comprise multiple thermally conductive fins 911, and the refrigerant side multiple thermally conductive fins 912. In one embodiment, thermally conductive fins 911, 912 are thermally conductive pin fins that extend between and attach to solid surfaces on both sides of the fins. The fins 911, 912 themselves extend into the respective flow paths 900, 901 and enhance the heat transfer surface area on the coolant side and the refrigerant side of the heat exchanger to facilitate the heat exchange function. As illustrated, thermally conductive fins 911, 912 extend in opposite directions from the centrally disposed, thermally conductive heat exchange plate 910, which serves as the boundary between the two sides of the heat exchanger.

In operation, coolant flows through coolant path 901 by ingressing through a coolant inlet 902 and egressing via a coolant outlet 903 of the coolant-to-refrigerant heat exchanger 801, and refrigerant flows, for example, in an opposite direction, through coolant path 901 by ingressing via a refrigerant inlet 904 and egressing via a refrigerant outlet

905. One or more heaters 820 are integrated with the heat exchanger, for example, by a affixing the heater(s) 820 to a surface of the heat exchanger, or by constructing the heat exchanger with the heater(s) 820 integrally formed therewith. As one example, heater(s) 820 could be bolted to an exterior surface of the heat exchanger, for example, adjacent to the coolant side of the heat exchanger, so as to be in thermal communication with coolant flowing through the coolant path 900. By way of example, heater 820 comprises a thermally conductive block 920 with an embedded resistive heater 921 disposed therein that is controlled via one or more control lines 922, 923 controlled, for example, by a controller 460, such as depicted in FIG. 8. In an alternate implementation, each heater 820 could comprise one or more cylindrical-shaped resistive heaters at least partially embedded within thermally conductive block 920, and controlled to provide the auxiliary heat load desired.

Heat exchanger assembly 800' of FIG. 9B is identical to heat exchange assembly 800 of FIG. 9A, with the exception that the heater(s) 820 is disposed adjacent to and in thermal communication with the refrigerant side of the heat exchanger. In both cases, the heater is integrated with the heat exchanger, for example, by affixing the heater 820 to a surface of the heat exchanger, or by constructing the heat exchanger with the controllable heater 820 integrally formed therein.

As with the coolant heater described above in connection with the cooling apparatus of FIG. 4, heater 820 integrated within heat exchange assembly 800, 800' (FIGS. 9A & 9B) is configured to provide an auxiliary heat load to refrigerant passing through coolant-to-refrigerant heat exchanger 810. In the heat exchange assembly embodiment of FIG. 9A, the auxiliary heat load applied by heater 820 is transferred via the outer surface of the heat exchanger through the plurality of thermally conductive fins 911 and through coolant flowing through the heat exchanger to the thermally conductive heat exchange plate 910 separating the coolant side and the refrigerant side, before being dissipated to the refrigerant passing through the refrigerant flow path 901 of the heat exchanger.

As noted, in one embodiment, heater 820 comprises an embedded resistive heater 921 within a thermally conductive block 920, such as copper of aluminum. (Alternatively, a plurality of cylindrical-shaped heater cartridges could at least partially reside within respective cylindrical cavities in the thermally conductive block, and which may be controlled together to provide the desired auxiliary heat load.) Electrical current feed lines 922, 923 allow control of the heat load being dissipated by the embedded resistive heater. In one embodiment, electrical current feed lines 922, 923 are controlled by a controller, such as controller 460 in the cooling apparatus embodiment of FIG. 8. Integration of heater(s) 820 in direct thermal contact with the coolant side of the heat exchanger allows a controller on the coolant loop side of the cooling apparatus to be employed in controlling the heater. In such a case, the coolant side of the heat exchanger could be decoupled from the refrigerant side, and the controllable heater could be removed, with the balance of the coolant side sub-assembly, for example, if desired for replacement or repair. In one implementation, the controllable heater could bolt onto a surface of the coolant-to-refrigerant heat exchanger, with a thermal interface material being employed between the contacting surfaces.

In the alternate implementation of FIG. 9B, heater(s) 820 is shown integrated with a refrigerant side surface of the coolant-to-refrigerant heat exchanger. Heater(s) 820 can be affixed to the refrigerant side of the heat exchanger using any appropriate means which allows for the thermal communication of the controllable heater with the refrigerant passing through the refrigerant flow path. For example, heater(s) 820 could be bolted to the heat exchanger, with a thermal interface material being employed between the opposing main surfaces of the heater and heat exchanger. Affixing heater(s) 820 to the refrigerant side of the heat exchanger advantageously facilitates more direct application of the auxiliary heat load to the refrigerant passing through the heat exchanger. This implementation may be advantageously employed in those cases where disassembly of the cooling apparatus is not anticipated.

FIGS. 10A-10E depict an alternate embodiment of a heat exchange assembly, generally denoted 1000, in accordance with an aspect of the present invention. In this embodiment, the heaters 1021 are embedded within the heat exchanger 1010.

Referring collectively to FIGS. 10A-10E, heat exchange assembly 1000 comprises a plate-type heat exchanger, where a series of plates 1040 form stacked, U-shaped channels for fluid flow. In this implementation, U-shaped coolant flow channels 1030 and U-shaped refrigerant flow channels 1031 are interleaved within the heat exchanger. A coolant inlet 1011 and coolant outlet 1012 are respectively in fluid communication with a coolant inlet plenum 1013 and a coolant outlet plenum 1014, which (in the embodiment illustrated) extend vertically within the heat exchanger at one end of the heat exchanger. The coolant inlet and outlet plenums 1013, 1014 are each in fluid communication with respective ends of the U-shaped coolant flow channels 1030 to pass a coolant flow 1032 therethrough. Similarly, a refrigerant inlet 1015 and refrigerant outlet 1016 are provided in fluid communication with a refrigerant inlet plenum 1017 and a refrigerant outlet plenum 1018, each of which is in fluid communication with respective ends of the U-shaped refrigerant flow channels 1031 to pass a refrigerant flow 1033 therethrough. Baffles 1050, 1051 facilitate separation of the coolant and refrigerant within the heat exchanger and the directing of the coolant flows 1032 and the refrigerant flows 1033 through the respective flow channels 1030, 1031.

Figure 10A:
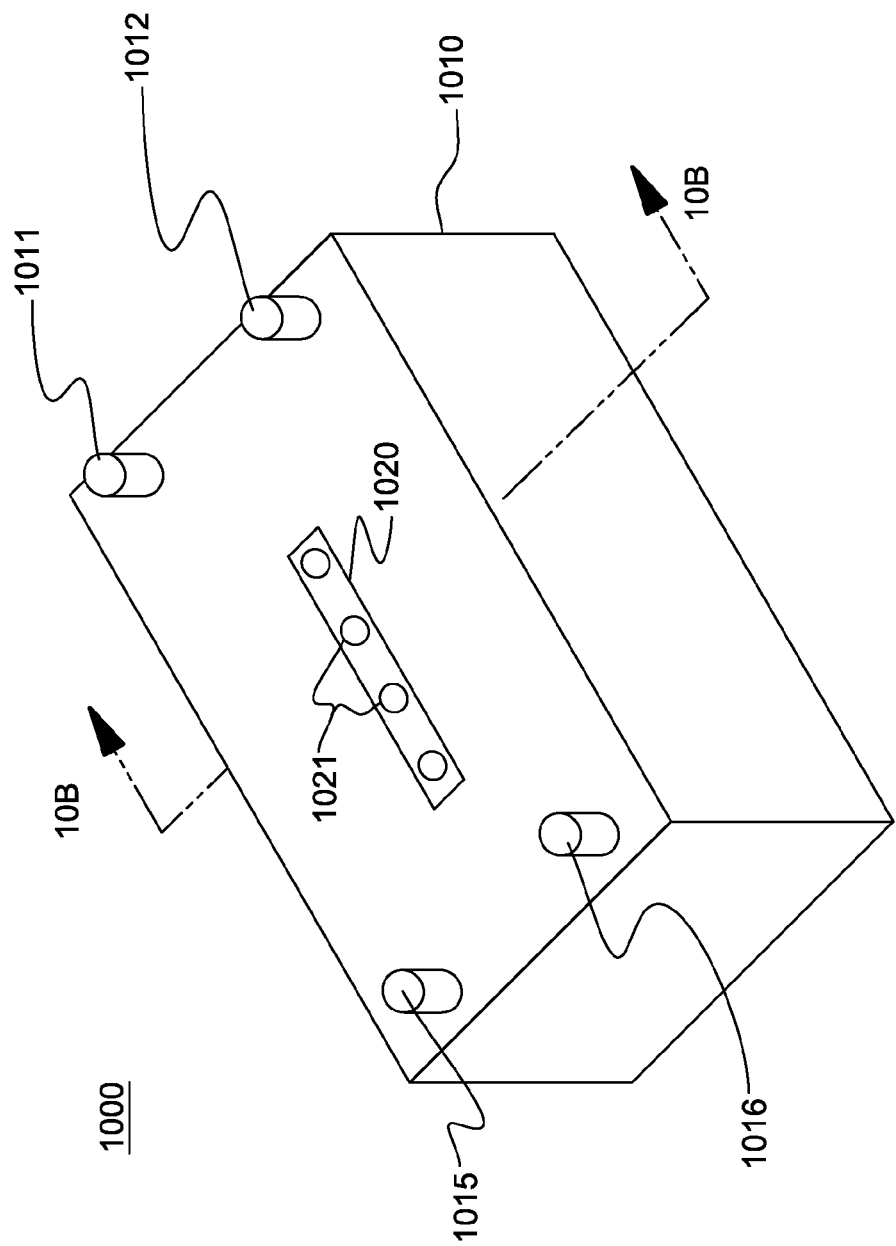
FIG. 10A is an isometric view of a further embodiment of a heat exchange assembly comprising a coolant-to-refrigerant heat exchanger and an integrated heater, in accordance with an aspect of the present invention.
Figure 10B:
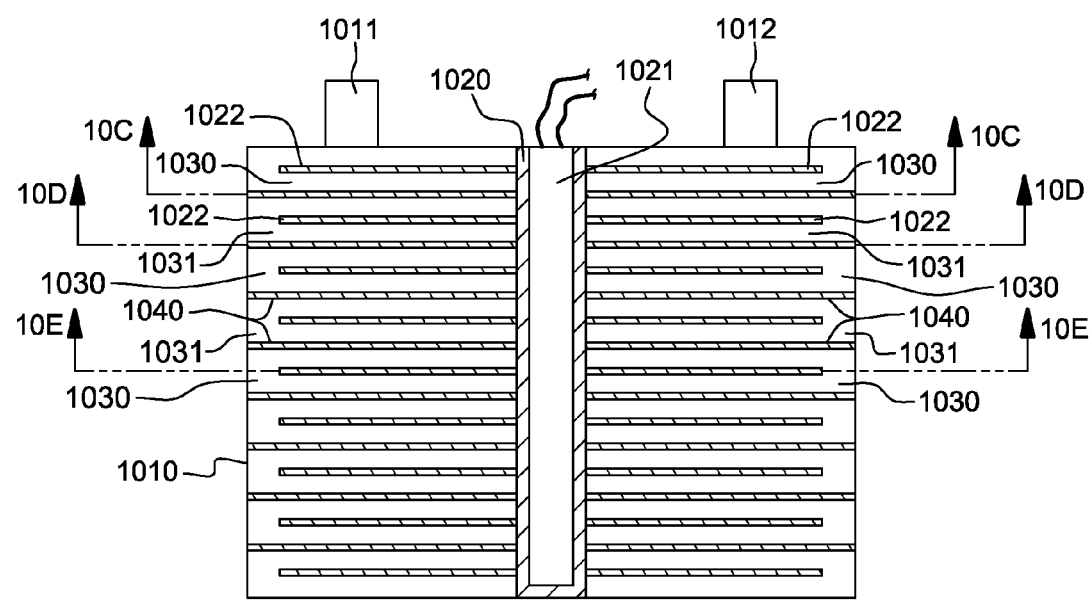
FIG. 10B is a cross-sectional elevational view of the heat exchange assembly of FIG. 10A, taken along line 10B-10B thereof, in accordance with an aspect of the present invention.
Figure 10C:
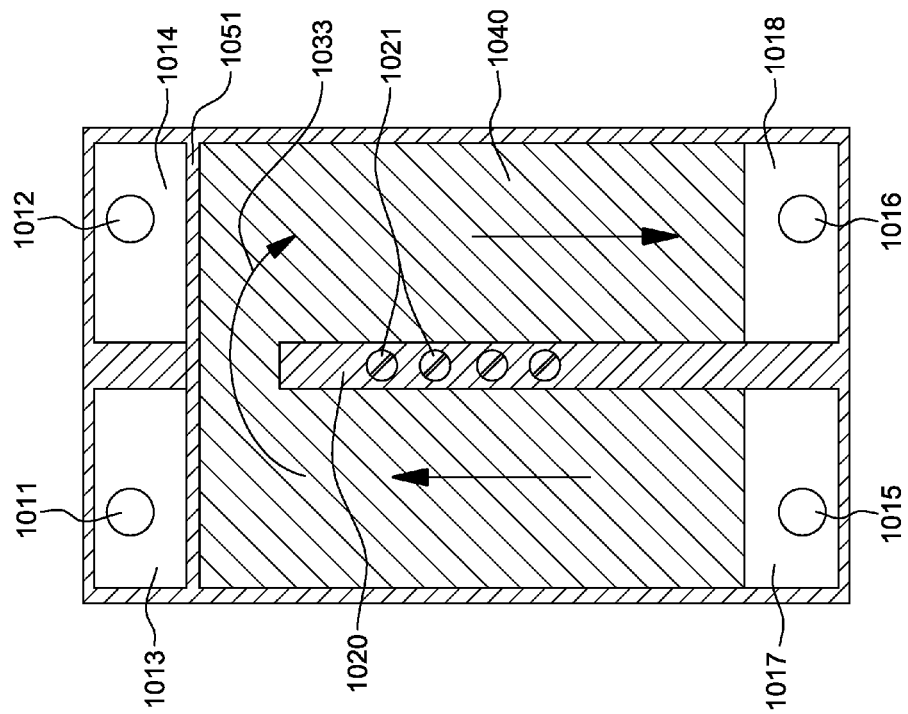
FIG. 10C is a cross-sectional plan view of the heat exchange assembly of FIG. 10A, taken along line 10C-10C of FIG. 10B, in accordance with an aspect of the present invention.
Figure 10D:
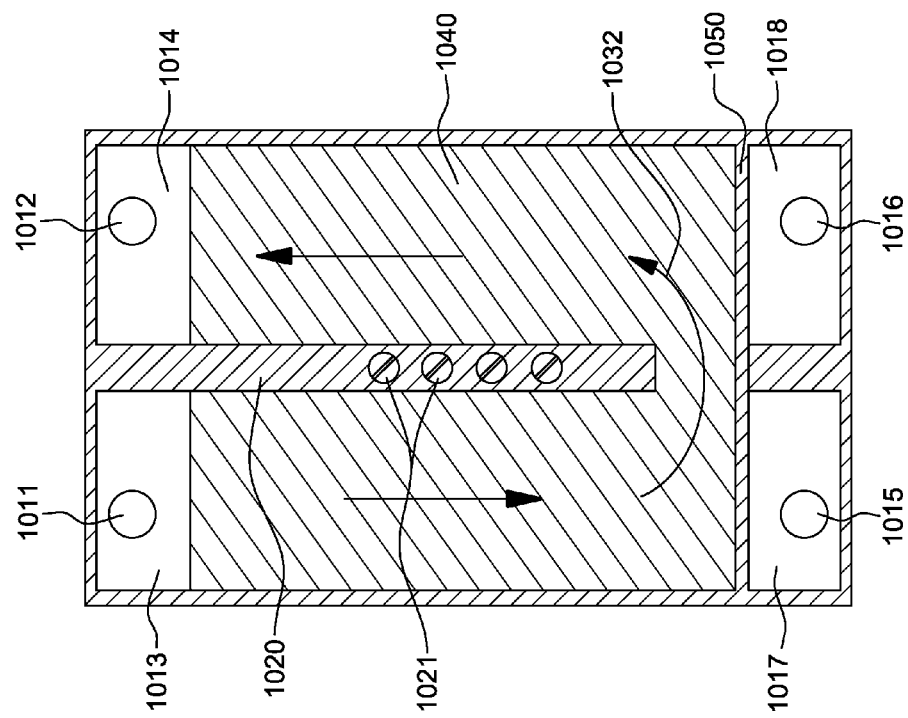
FIG. 10D is a cross-sectional plan view of the heat exchange assembly of FIG. 10A, taken along line 10D-10D of FIG. 10B, in accordance with an aspect of the present invention.
Figure 10E:
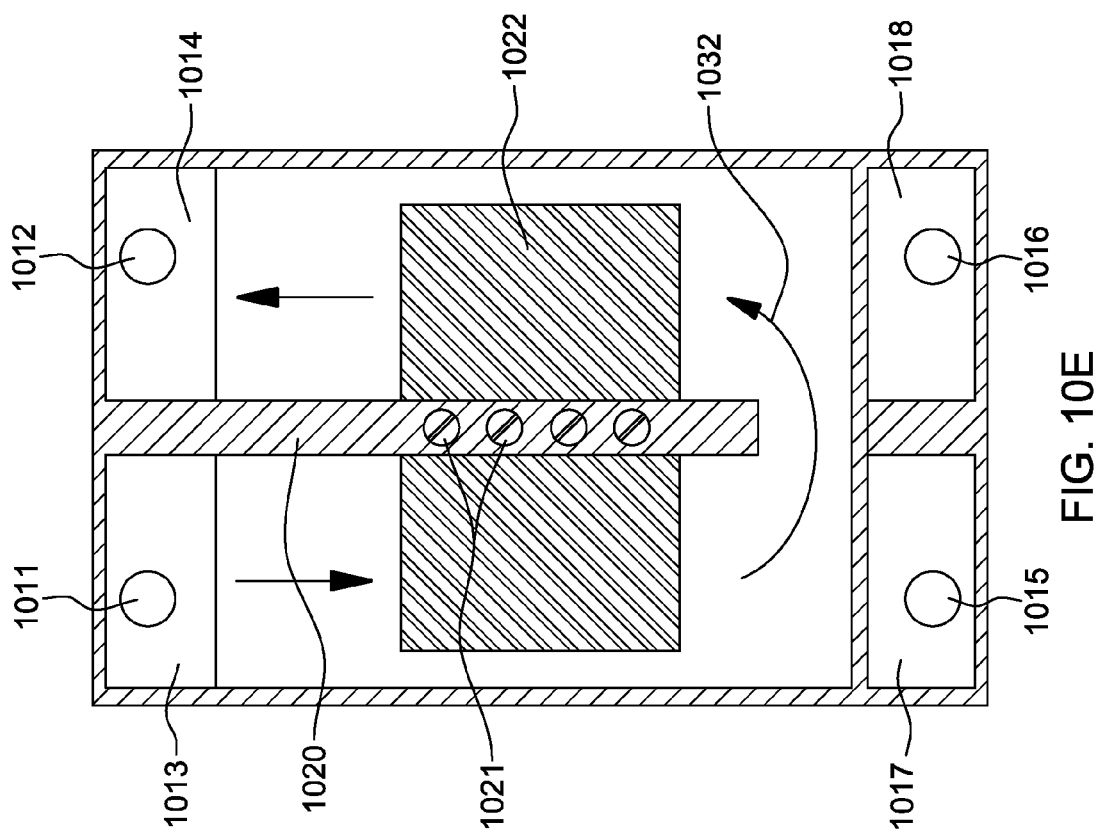
FIG. 10E is a cross-sectional plan view of the heat exchange assembly of FIG. 10A, taken along line 10E-10E of FIG. 10B, in accordance with an aspect of the present invention.

In the illustrated implementation, multiple heaters 1021 are embedded within a central, thermally conductive plate 1020 of the heat exchanger. As illustrated in FIGS. 10B & 10E, a plurality of thermally conductive heater fins 1022 extend from the central, thermally conductive plate 1020 into (in this embodiment) both the U-shaped coolant flow channels 1030 and the U-shaped refrigerant flow channels 1031 stacked in interleaved manner within the heat exchanger. The thermally conductive heater fins 1022 facilitate transfer of the auxiliary heat load from the multiple embedded heaters 1021 to, ultimately, the refrigerant passing through the coolant-to-refrigerant heat exchanger. Although in the embodiment illustrated, heater fins 1022 extend into both the coolant flow path and the refrigerant flow paths, in alternate implementations, the heater fins could extend into only the refrigerant flow path(s), or extend only into the coolant flow path(s), as desired for a particular implementation. In addition, although shown as a single plate fin in FIG. 10E, each heater fin could alternatively comprise a plurality of plate fins, or a plurality of pin fins, extending from central thermally conductive block 1020 into the respective coolant and/or refrigerant flow paths. The fins that are immersed in the fluid streams could also extend to both sides such that in plan view, the heater fins could have a T-shape. This implementation might be desirable where increased heater fin surface area is needed. When auxiliary heat load is desired, one or more of the embedded heaters 1021 are activated, and the auxiliary heat load is dissipated into the refrigerant stream(s) via, in part, the heater fins 1022 exposed to the flowing coolant and refrigerant.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electro-magnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electro-magnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 11:
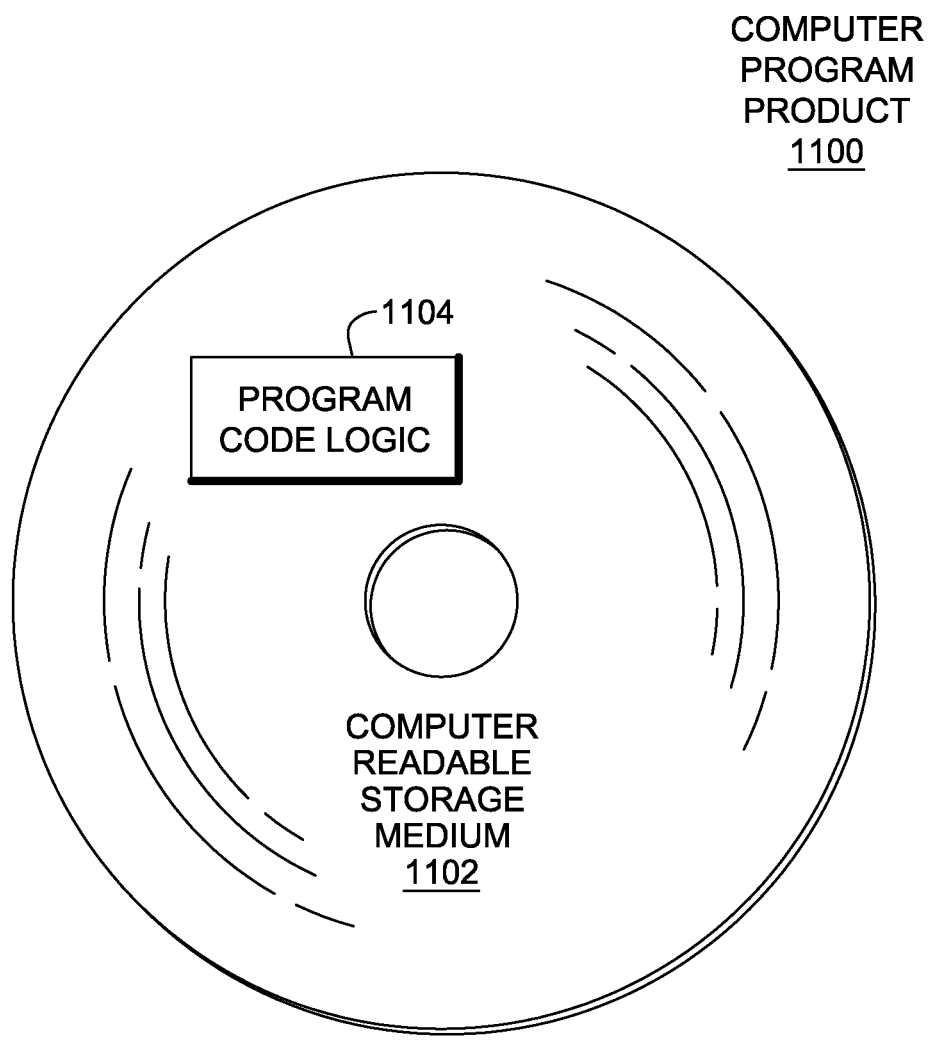
FIG. 11 depicts one embodiment of a computer program product incorporating one or more aspects of the present invention.

Referring now to FIG. 11, in one example, a computer program product 1100 includes, for instance, one or more computer readable storage media 1102 to store computer readable program code means or logic 1104 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples.

Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used. Further, other types of programs and/or other optimization programs may benefit from one or more aspects of the present invention, and other resource assignment tasks may be represented. Resource assignment tasks include the assignment of physical resources. Moreover, although in one example, the partitioning minimizes communication costs and convergence time, in other embodiments, the cost and/or convergence time may be otherwise reduced, lessened, or decreased.

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. A heat exchange assembly comprising;
    a coolant-to-refrigerant heat exchanger comprising a coolant inlet and a coolant outlet coupled to a coolant loop for passing a liquid coolant therethrough, and a refrigerant inlet and a refrigerant outlet coupled to a vapor-compression refrigeration loop for separately passing a refrigerant therethrough, the coolant-to-refrigerant heat exchanger cooling the liquid coolant passing therethrough by dissipating heat from the liquid coolant passing therethrough to the refrigerant passing therethrough, wherein the refrigerant ingressing through the refrigerant inlet comprises, at least in part, liquid refrigerant;
    a heater integrated with the coolant-to-refrigerant heat exchanger for applying an auxiliary heat load to the refrigerant passing through the coolant-to-refrigerant heat exchanger, the auxiliary heat load applied by the heater ensuring that a total heat load transferred by the coolant-to-refrigerant heat exchanger to the refrigerant is at least a specified minimum heat load, the specified minimum heat load being a pre-specified value which ensures that the refrigerant egressing from the refrigerant outlet of the coolant-to-refrigerant heat exchanger is in vapor state; and wherein the coolant-to-refrigerant heat exchanger comprises a plurality of coolant flow channels defining a plurality of coolant flow paths extending, at least in part, in a U-shape around a central region of the coolant-to-refrigerant heat exchanger and disposed between the coolant inlet and the coolant outlet, and a plurality of refrigerant flow channels defining a plurality of refrigerant flow paths extending, at least in part, in a U-shape around the central region of the coolant-to-refrigerant heat exchanger, and disposed between the refrigerant inlet and the refrigerant outlet, and wherein the plurality of coolant flow channels are interleaved in a stack with the plurality of refrigerant flow channels within the coolant-to-refrigerant heat exchanger, and the heater is disposed in the central region of the coolant-to-refrigerant heat exchanger, the central region being a central region of the stack of interleaved coolant flow channels and refrigerant flow channels.

2. The heat exchange assembly of claim 1, wherein the specified minimum heat load is a prespecified value ensuring that the refrigerant egressing from the refrigerant outlet of the coolant-to-refrigerant heat exchanger is in superheated vapor state, and wherein the vapor-compression refrigeration loop comprises an expansion valve comprising a fixed orifice opening.

3. The heat exchange assembly of claim 1, wherein the heater is disposed adjacent to and in thermal communication with liquid coolant passing through the plurality of coolant flow channels of the coolant-to-refrigerant heat exchanger.

4. The heat exchange assembly of claim 1, wherein the heater is disposed adjacent to and in thermal communication with the refrigerant passing through the plurality of refrigerant flow channels of the coolant-to-refrigerant heat exchanger.

5. The heat exchange assembly of claim 1, wherein the heater is at least partially surrounded by and disposed between, and is in thermal communication with both the plurality of coolant flow channels and the plurality of refrigerant flow channels interleaved in the stack of the coolant-to-refrigerant heat exchanger.

6. The heat exchange assembly of claim 1, wherein the heater comprises a resistance heater embedded within a plate surrounded, at least partially, by the plurality of coolant flow channels and the plurality of refrigerant flow channels of the coolant-to-refrigerant heat exchanger.

7. The heat exchange assembly of claim 1, wherein the heater embedded in the central region of the stack of interleaved coolant flow channels and refrigerant flow channels extends transverse to the plurality of coolant flow channels and the plurality of refrigerant flow channels of the stack.

8. The heat exchange assembly of claim 1, further comprising heater fins extending into the plurality of refrigerant flow channels of the coolant-to-refrigerant heat exchanger, the fins being in thermal contact with the heater for facilitating transfer of the auxiliary heat load to the refrigerant passing through the coolant-to-refrigerant heat exchanger to ensure that the refrigerant absorbs at least the specified minimum heat load.

9. The heat exchange assembly of claim 1, wherein the heat exchange assembly further comprises heater fins extending into the plurality of coolant flow channels of the coolant-to-refrigerant heat exchanger and into the plurality of refrigerant flow channels of the coolant-to-refrigerant heat exchanger for facilitating dissipation of the auxiliary heat load to the refrigerant passing through the coolant-to-refrigerant heat exchanger.

10. The heat exchange assembly of claim 1, wherein the heater is a controllable heater, the controllable heater being dynamically adjustable to control the auxiliary heat load applied thereby to the refrigerant passing through the coolant-to-refrigerant heat exchanger to facilitate ensuring that the refrigerant passing through the coolant-to-refrigerant heat exchanger absorbs at least the specified minimum heat load.

11. An apparatus for facilitating cooling of an electronic component, the apparatus comprising:

a coolant-cooled structure, the coolant-cooled structure being in thermal communication with the electronic component;

a coolant loop coupled in fluid communication with the coolant-cooled structure, the coolant loop comprising a liquid coolant;

a vapor-compression refrigeration loop, the vapor-compression refrigeration loop comprising a refrigerant;

a heat exchange assembly, the heat exchange assembly comprising:

a coolant-to-refrigerant heat exchanger, the coolant-to-refrigerant heat exchanger comprising a coolant inlet and a coolant outlet coupled in fluid communication with the coolant loop for passing the liquid coolant therethrough, and a refrigerant inlet and a refrigerant outlet coupled in fluid communication with the vapor-compression refrigeration loop for passing the refrigerant therethrough, the coolant-to-refrigerant heat exchanger cooling the liquid coolant passing therethrough by dissipating heat from the liquid coolant passing therethrough to the refrigerant passing therethrough, wherein the refrigerant ingressing through the refrigerant inlet comprises, at least in part, liquid refrigerant;

a heater integrated with the coolant-to-refrigerant heat exchanger, the heater applying an auxiliary heat load to the refrigerant passing through the coolant-to-refrigerant heat exchanger which ensures that a total heat load transferred by the coolant-to-refrigerant heat exchanger to the refrigerant is at least a specified minimum heat load, the specified minimum heat load being a pre-specified value which ensures that the refrigerant egressing from the refrigerant outlet of the coolant-to-refrigerant heat exchanger is in vapor state; and wherein the coolant-to-refrigerant heat exchanger comprises a plurality of coolant flow channels defining a plurality of coolant flow paths extending at least in part, in a U-shape around a central region of the coolant-to-refrigerant heat exchanger, and disposed between the coolant inlet and the coolant outlet, and a plurality of refrigerant flow channels defining a plurality of refrigerant flow paths extending, at least in part, in a U-shape around the central region of the coolant-to-refrigerant heat exchanger, and disposed between the refrigerant inlet and the refrigerant outlet, and wherein the plurality of coolant flow channels are interleaved in a stack with the plurality of refrigerant flow channels within the coolant-to-refrigerant heat exchanger, and the heater is disposed in the central region of the coolant-to-refrigerant heat exchanger, the central region being a central region of the stack of interleaved coolant flow channels and refrigerant flow channels.

12. The apparatus of claim 11, further comprising a compressor coupled in fluid communication with the vapor-compression refrigeration loop, and wherein the specified minimum heat load is prespecified to ensure that superheated refrigerant vapor enters the compressor, and the vapor-compression refrigeration loop comprises an expansion valve comprising a fixed orifice opening.

13. The apparatus of claim 11, further comprising a controller coupled to the heater for automatically controlling the auxiliary heat load applied by the heater to the refrigerant passing through the coolant-to-refrigerant heat exchanger to maintain the total heat load transferred by the coolant-to-refrigerant heat exchanger to the refrigerant substantially constant over time irrespective of variation in temperature of the liquid coolant.

14. The apparatus of claim 13, wherein the controller automatically adjusts the auxiliary heat load applied by the heater to the refrigerant passing through the coolant-to-refrigerant heat exchanger responsive to a change in heat load of the electronic component.

15. The apparatus of claim 14, further comprising an adjustable pump in fluid communication with the coolant loop for pumping the liquid coolant through the coolant loop, and wherein the controller operates to maintain a temperature of the electronic component within a specified temperature range by dynamically increasing pump speed of the adjustable pump responsive to temperature of the electronic component being above a first specified temperature, and by dynamically reducing pump speed of the adjustable pump responsive to temperature of the electronic component being below a second specified temperature.

16. The apparatus of claim 13, further comprising a temperature sensor for monitoring a temperature associated with the electronic component, and wherein the controller automatically increases auxiliary heat load applied by the heater to the refrigerant passing through the coolant-to-refrigerant heat exchanger responsive to the monitored temperature being below a specified temperature, and automatically decreases heat load applied by the heater to the refrigerant passing through the coolant-to-refrigerant heat exchanger responsive to the monitored temperature of the electronic component being above another specified temperature, wherein the another specified temperature is greater than the specified temperature.

17. The apparatus of claim 13, farther comprising a temperature sensor for monitoring, a temperature of coolant within the coolant loop, and wherein the controller automatically adjusts the auxiliary heat load applied by the heater to the refrigerant passing through the coolant-to-refrigerant heat exchanger with reference to the monitored temperature of the liquid coolant within the coolant loop, wherein the auxiliary heat load applied by the heater is automatically increased responsive to the monitored temperature being below a specified temperature, and is automatically decreased responsive to the monitored temperature being above another specified temperature, wherein the another specified temperature is greater than the specified temperature.

18. The apparatus of claim 11, wherein the heater is disposed adjacent to and in thermal communication with the liquid coolant passing through the plurality of coolant flow channels interleaved in the stack of the coolant-to-refrigerant heat exchanger.

19. The apparatus of claim 11, wherein the heater is disposed adjacent to and in thermal communication with the refrigerant passing through the plurality of refrigerant flow channels interleaved in the stack of the coolant-to-refrigerant heat exchanger.

20. A method of facilitating cooling of an electronic component, the method comprising:
coupling in thermal communication a coolant-cooled structure to the electronic component;
providing a coolant loop in fluid communication with the coolant-cooled structure for passing a liquid coolant through the coolant-cooled structure;
providing a coolant-to-refrigerant heat exchanger in fluid communication with the coolant-cooled structure via the coolant loop to receive the liquid coolant therefrom and provide the liquid coolant thereto;
providing a vapor-compression refrigeration loop in fluid communication with the coolant-to-refrigerant heat exchanger, the coolant-to-refrigerant heat exchanger being configured to cool the liquid coolant passing therethrough by dissipating heat from the liquid coolant passing therethrough to refrigerant of the vapor-compression refrigeration loop passing therethrough, and wherein the refrigerant ingressing into the coolant-to-refrigerant heat exchanger from the vapor-compression refrigeration loop comprises, at least in part, liquid refrigerant;
integrating a heater in thermal communication with the coolant-to-refrigerant heat exchanger, the heater applying an auxiliary heat load to the refrigerant passing through the coolant-to-refrigerant heat exchanger which ensures that a total heat load transferred by the coolant-to-refrigerant heat exchanger to the refrigerant is at least a specified minimum heat load, the specified minimum heat load being a pre-specified value ensuring that the refrigerant egressing from the coolant-to-refrigerant heat exchanger is in vapor state; and
wherein the coolant-to-refrigerant heat exchanger comprises a plurality of coolant flow channels defining a plurality of coolant flow paths extending, at least in part, in a U-shape around a central region of the coolant-to-refrigerant heat exchanger and disposed between the coolant inlet and the coolant outlet, and a plurality of refrigerant flow channels defining a plurality of refrigerant flow paths extending, at least in part, in a U-shape around the central region of the coolant-to-refrigerant heat exchanger, and disposed between the refrigerant inlet and the refrigerant outlet, and wherein the plurality of coolant flow channels are interleaved in a stack with the plurality of refrigerant flow channels within the coolant-to-refrigerant heat exchanger, and the heater is disposed in the central region of the coolant-to-refrigerant heat exchanger, the central region being a central region of the stack of interleaved coolant flow channels and refrigerant flow channels.

* * * * *